United States Patent
Seguine et al.

(10) Patent No.: US 8,839,184 B1
(45) Date of Patent: Sep. 16, 2014

(54) COMPUTER-ASSISTED ROUTER FOR A PROGRAMMABLE DEVICE

(71) Applicant: Cypress Semiconductor Corporation, San Jose, CA (US)

(72) Inventors: Dennis Raymond Seguine, Temecula, CA (US); Adriy Ivanets, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/204,440

(22) Filed: Mar. 11, 2014

Related U.S. Application Data

(60) Provisional application No. 61/776,949, filed on Mar. 12, 2013.

(51) Int. Cl.
*G06F 17/50* (2006.01)

(52) U.S. Cl.
CPC .................................. *G06F 17/5077* (2013.01)
USPC ........... 716/139; 716/110; 716/116; 716/119; 716/126

(58) Field of Classification Search
CPC . G06F 17/5054; G06F 21/76; G06F 17/5068; G06F 17/5077
USPC .......................... 716/110, 116, 119, 126, 139
See application file for complete search history.

(56) References Cited

U.S. PATENT DOCUMENTS

| | | | |
|---|---|---|---|
| 6,405,355 B1 | 6/2002 | Duggirala et al. | |
| 7,100,139 B1 * | 8/2006 | Anderson et al. | 716/117 |
| 7,302,667 B1 | 11/2007 | Pritchard | |
| 7,584,448 B1 * | 9/2009 | Reynolds et al. | 716/138 |
| 8,099,700 B1 | 1/2012 | Waller et al. | |
| 8,332,805 B1 | 12/2012 | Birch et al. | |
| 8,407,645 B1 * | 3/2013 | Caranci et al. | 716/126 |
| 8,479,139 B1 | 7/2013 | Baldsdon et al. | |
| 2003/0188271 A1 | 10/2003 | Zhuang et al. | |
| 2008/0134127 A1 * | 6/2008 | Allen et al. | 716/17 |
| 2013/0298100 A1 * | 11/2013 | Hastings et al. | 716/126 |

FOREIGN PATENT DOCUMENTS

WO 03088098 A 10/2003

OTHER PUBLICATIONS

"Verification and Board-Level Tools," altera.com [online], [retrieved on Jun. 16, 2014] retrieved from Internet <URL: http://www.altera.com/products/software/quartus-ii/subscription-edition/verification-board-level/swf-ver-bdlevel.html>.

Podbelski, Aaron GL, "The Joy of Precision Analog: True System-on-Chip Performance," Embedded.com [online], published Nov. 2009, [retrieved on Oct. 10, 2013], retrieved from Internet <URL: http://www.embedded.com/products/integratedcircuits/221600186>.

(Continued)

*Primary Examiner* — Paul Dinh

(57) ABSTRACT

Techniques for computer-assisted routing of an electronic design for a programmable target device are described herein. In an example embodiment, a computer system displays a representation of the programmable target device in a user interface. The computer system receives first user input that indicates a first component in the electronic design for the programmable target device. The computer system determines one or more second components of the electronic design that can be routed to the first component and displays one or more visual objects that indicate the one or more second components. The computer system then receives second user input that selects a particular component from the one or more second components and stores interconnect data indicating that the first component is routed to the particular component.

20 Claims, 16 Drawing Sheets

(56) References Cited

OTHER PUBLICATIONS

Setliff, Dorothy, "Application Domain: Routing Algorithms," Automatic Programming Applied to VLSI CAD Sofh't'ste: A Case Study, Chapter 10, 1990, pp. 13-32.

Srinivasan, Krishnan, "An Automated Technique for Topology and Route Generation of Application Specific On-Chip Interconnection Networks," IEEE/ACM International Conference on Computer-Aided Design, Nov. 6-10, 2005, p. 231-237.

* cited by examiner

COMPUTER-ASSISTED ROUTER FOR A PROGRAMMABLE DEVICE

PRIORITY

This application claims the priority and benefit of U.S. Provisional Application No. 61/776,949 filed on Mar. 12, 2013, the entire contents of which are incorporated by reference herein.

TECHNICAL FIELD

This disclosure relates to the field of Electronic Design Automation (EDA).

BACKGROUND

Because of the ever-increasing design complexity of electronic products, the capabilities of the EDA programs (tools) used in the design process become ever more important in reducing the cost and development cycles of such products. For example, the capabilities of EDA tools may be key in helping a user/designer to evaluate early in the design process how the circuitry of a given design can be mapped to, and placed on, a given target device. Such EDA tool capabilities become even more important when an electronic design needs to be implemented on a device (e.g., such as a system-on-chip) with programmable interconnects that can carry digital and/or analog signals between arbitrary or nearly arbitrary sets of hardware element terminals and/or input/output pins.

For example, a programmable interconnect of a device may include a large number of traces and switches that can be programmed (e.g., in the firmware of the device) to implement a large number of routes between various design components. However, while a large number of traces and switches produces a more flexible interconnect, it also increases the complexity faced by the user/designer when mapping a particular design to the hardware elements of a programmable target device. Thus, in order to find an optimal mapping for the design, during the design process a user/designer should be able to quickly find and evaluate multiple different routes that can be programmed for any given design component placed on the target device.

DETAILED DESCRIPTION

Figure 1A:
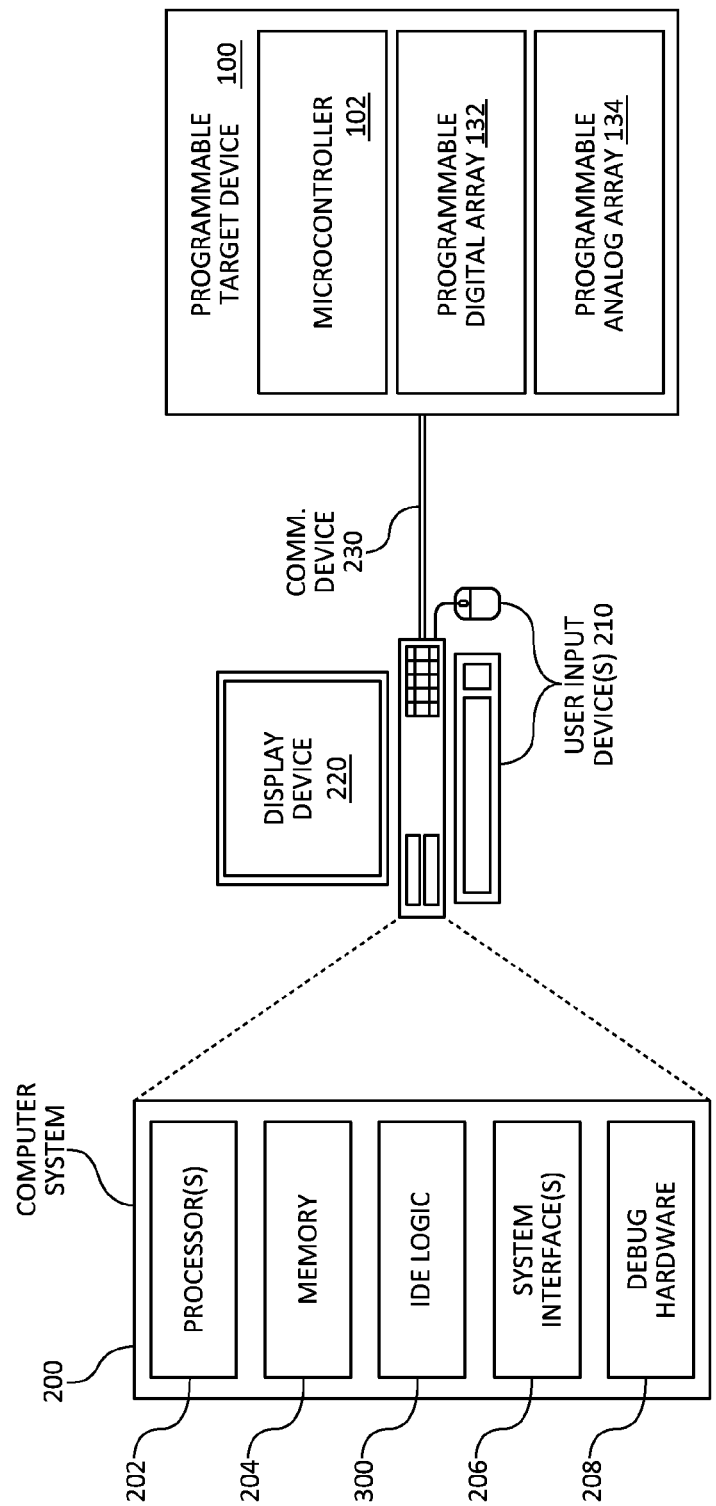
FIG. 1A illustrates an example operational context in which embodiments may be implemented.

The following description sets forth numerous specific details such as examples of specific systems, elements, components, methods, and so forth, in order to provide a good understanding of various embodiments of the techniques described herein for auto-routing in representation editing of electronic designs. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

References in the description to "an embodiment", "one embodiment", "an example embodiment", "some embodiments", and "various embodiments" mean that the particular feature, structure, or characteristic being referred to is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

As used herein, "target device", "programmable device" and "programmable target device" refer to a device that includes programmable hardware elements (e.g., macrocells, programmable digital blocks, programmable analog blocks, etc.) as well as one or more interconnects (e.g., digital interconnect, analog interconnect, etc.) with hardware elements (e.g., switches, multiplexers, hubs, buses, etc.) that can be programmed and/or re-programmed by firmware configuration (e.g., software and/or hardware configuration files) that is installed on the device. Examples of such programmable devices include programmable chips such as systems-on-chip, processors, microcontrollers, Field-Programmable Gate Arrays (FPGAs), Field-Programmable Analog Arrays (FPAAs), Programmable Logic Devices (PLDs), Complex PLDs (CPLDs), or other processing devices that have programmable hardware elements.

As used herein, "electronic design" refers to a dataset representing electronic components and/or hardware circuitry that can perform certain specified functionalities during the operation of a programmable target device. In some embodiments, the techniques for auto-routing described herein may be implemented for a mixed-signal electronic design having an analog portion (with analog architecture that includes components through which analog signals can be routed) and digital portion (with digital architecture that includes components through which digital signals can be routed). In some embodiments, the techniques described herein may be implemented for an electronic design that has a predominant analog portion with a few digital components (e.g., such as components that convert a digital signal to an analog signal). In other embodiments, the techniques described herein may be implemented for an electronic design that has a predominant digital portion with a few analog components that form analog routes (e.g., such as components that convert analog signals to digital signals).

In various embodiments, the techniques for auto-routing described herein may comprise one or more methods that are executed by one or more computer systems or computing devices. Although the operations of such method(s) are shown and described hereinafter in a particular order, the operations of each method may be altered so that certain operations may be performed in a different order or so that certain operation(s) may be performed, at least in part, concurrently and/or in parallel with other operations. In other embodiments, instructions or sub-operations of distinct operations may be executed in an intermittent and/or alternating manner. Thus, the various method embodiments of the described techniques, as well as the order of operations therein, are to be regarded in an illustrative rather than a restrictive sense.

I. Overview

One of the problems of existing EDA tools is the difficultly in routing signals from a pin to a block output, from a block input to a pin, or from other resources to a pin or block input/output. In such EDA tools, the selection of routing during the editing phase of the design development cycle is done manually with additional actions needed from a user/designer. The user/designer may need to make quite a few intermediate steps and monitor a large number of pins, block inputs/outputs, and routing resources in order to design a route for a signal from a block input/output to a pin and/or a resource.

For example, some existing EDA tools require the user/designer to manually set all connections and routing configurations between inputs/outputs, routing resources, and pins. By way of illustration, to route a signal from a block output to a pin in the schematic of a certain electronic design for a target device, the user/designer must manually set the following routing connections between: the block output and a row output of a local/horizontal interconnect, the row output and a global output of a global/vertical interconnect, and the global output and a device terminal that corresponds to the endpoint pin in the route. During these manual steps, the user/ designer needs to keep track of at least the row output identifier, the local interconnect output identifier, the global interconnect output identifier and its settings, and the pin identifier with its assigned port number. In addition, the user/designer also needs to monitor which inputs/outputs, routing resources, and pins have been already assigned and which are still available. Needless to say, these challenges are exacerbated when the electronic design has a complicated schematic and/or when the target device provides the capability for programmable digital and/or analog blocks, numerous and/or programmable local and global interconnects, and a large number of pins and ports.

To address these challenges and other issues, techniques are described herein for auto-routing in editing of electronic designs. In some embodiments, the auto-routing techniques allow a user/designer to connect block inputs/outputs directly to a pin or resources without any manual intervening steps. For example, to route a signal from a programmable block output/input to a pin or routing resource, the user/designer needs to provide one or more keyboard input(s), general pointing device input(s), or a combination thereof to indicate a source component and to select a destination component, with the EDA tool engine automatically finding all possible/available routes based on the indicated source and highlighting the destinations of the routes for the user to select from. Thus, the techniques described herein (e.g., as embodied in an EDA tool) allow a user/designer to reduce the amount of manual steps needed to edit the schematic of an electronic design, to find all possible/available routes and their destinations/endpoints from a given source/start component, and to evaluate and choose the optimal route from the available routes. In turn, this allows the user/designer to evaluate the electronic circuits in the target device quickly and easily during the product design phase, instead of conducting complicated tests during the product testing phase.

In an example embodiment of the auto-routing techniques described herein, a computer system displays a representation (e.g., a diagram) of a programmable target device in a user interface. The computer system receives first user input in the user interface, where the first user input indicates a first component in an electronic design for the programmable target device. The computer system determines one or more second components of the electronic design that can be routed to the first component and displays, in the user interface, one or more visual objects that indicate the one or more second components. The computer system then receives second user input in the user interface, where the second user input selects a particular component from the one or more second components. The computer system then stores interconnect data indicating that the first component is routed to the particular component.

In other embodiments, the techniques for auto-routing described herein may be embodied as a set of instructions that are stored on non-transitory computer-readable storage media. Such instructions, when executed by one or more processors (e.g., CPUs) of one or more computer systems, cause the one or more computer systems to perform the techniques described herein. In yet other embodiments, the techniques described herein may be embodied as an apparatus comprising one or more processors and non-transitory media that stores a set of instructions. The set of instructions, when executed by the one or more processors, causes the apparatus to perform the techniques described herein.

II. Examples of Operational Contexts, Programmable Target Devices, and Design Automation Flows FIG. 1A illustrates an example operational context in which embodiments of the techniques for auto-routing described herein may be implemented.

Referring to FIG. 1A, an exemplary programmable target device 100 is configured and/or programmed by computer system 200. Programmable target device 100 includes microcontroller 102 and one or more configurable hardware elements such as, for example, programmable array of digital blocks 132 and programmable array of analog blocks 134. Microcontroller 102 can be programmed (and re-programmed) and the programmable digital and analog arrays 132 and 134 can be configured (and reconfigured) to implement various applications and to perform a variety of functions.

An exemplary computer system 200 may be configured and/or programmed to execute processing logic that is configured and operable to perform the described auto-routing techniques. As used herein, "logic" refers to a set of instructions which, when executed by one or more processors, are configured and operable to perform one or more functionalities. In various embodiments and implementations, any such logic may be implemented as one or more software elements that are executable by one or more processors (e.g., such as central processing units, or CPUs), as one or more hardware elements (e.g., such as Application-Specific Integrated Circuits, or ASICs), or as any combination of one or more software and hardware elements. For example, any particular logic may be implemented, without limitation, as a standalone and/or client-server software application, as one or more software modules, as one or more libraries of functions, as one or more dynamically linked libraries, as one or more active X controls, and/or as one or more browser plug-ins. Further, in various embodiments the functionalities of any particular logic may be implemented in the same integrated module or may be combined in two or more modules that may provide some additional functionality. When executed on a computer system or in a distributed computing environment, a particular logic may be embodied as one or more computer processes, threads, or any other run-time entities that are allocated computing resources (e.g., such as memory, CPU time, persistent storage, and network bandwidth) to perform the logic's functionalities.

As illustrated in FIG. 1A, computer system 200 is configured to execute integrated development environment (IDE) logic 300, allowing for unified hardware and software development and for configuration of programmable target device 100 with hardware configuration files and software and/or firmware programming. Computer system 200 can include one or more processors 202 to execute IDE logic 300, for example, by executing instructions stored in memory 204 or in other computer-readable volatile and/or non-volatile storage media.

After hardware configuration files and software programming are generated, computer system 200 can program and/or configure programmable target device 100 with the developed hardware configuration and software/firmware programming, for example, through communication device 230. In some embodiments, device 230 can be a wired device, such as a Universal Serial Bus (USB) device, network interface card (e.g., such as Ethernet card), and the like, or it can be a wireless communication device that can establish a wireless link between computer system 200 and programmable target device 100.

Computer system 200 may also include system interface(s) 206 that allow the computer system to communicate with external devices, such as user input device(s) 210, display device 220, and programmable target device 100. For example, computer system 200 may include a system interface 206 to communicate with programmable target device 100 over communication device 230. In some embodiments, system interface(s) 206 can receive inputs, for example, through input device(s) 210, and present information, for example, via display device 220.

Computer system 200 and/or IDE logic 300 can generate hardware configuration and/or software applications for programmable target device 100 in response to user input, for example, from input device(s) 210. IDE logic 300 can include various development tools and/or programs that allow system designers to describe hardware circuitry for programmable target device 100, and to implement and provide software or firmware code for microcontroller 102. In some embodiments, IDE logic 300 can receive hardware description code that describes this hardware circuitry in an abstracted or generic manner, and can convert the generic code into device-specific configuration files that are particular to the architecture and/or resources (e.g., interconnects and other routing resources) of programmable target device 100. The hardware description code provided by the system designers may include schematic circuit diagrams and/or hardware code written according to a hardware description language, such as Verilog or VHDL.

Computer system 200 and/or IDE logic 300 can also generate application programming interfaces (APIs) based at least in part on the hardware description code. These APIs, when provided to programmable target device 100, can program microcontroller 102 to communicate with programmable digital and analog arrays 132 and 134 that are configured according to the device-specific configuration files.

Computer system 200 and/or IDE logic 300 can send the device-specific configuration files and the application programming interfaces to programmable target device 100. Programmable target device 100 can utilize the configuration files to configure particular hardware elements in the programmable digital and/or analog arrays 132 and 134 to implement the hardware circuitry described by the hardware description code. Programmable target device 100 can utilize the application programming interfaces to program the microcontroller 102 to communicate with the programmable digital and/or analog arrays 132 and 134 that are configured according to the device-specific configuration files.

After programmable target device 100 has been programmed with the hardware configuration and software/firmware programming developed with IDE logic 300, computer system 200 can execute debug hardware 208 to perform debugging operations on programmable target device 100. In some embodiments, debug hardware 208 can be located externally from computer system 200 and can communicate with the computer system via a system interface 206.

In various embodiments, a computer system such as computer system 200 may execute instructions to configure (and re-configure) various programmable target devices. Examples of such programmable devices include, but are not limited to, various programmable systems-on-chip or other systems that may include one or more processors, microcontrollers, FPGAs, FPAAs, PLDs, CPLDs, or other processing devices that have configurable hardware elements, such as, for example, interconnects with analog switches, programmable digital arrays, programmable analog arrays, and/or other similar elements.

One example of a programmable system-on-chip is a device from the Programmable System-on-Chip (PSoC™) family of products offered by Cypress Semiconductor Corporation of San Jose, Calif. A computer system, such as computer system 200, can execute processing logic that allows designers to develop applications for, and program, both the configurable hardware elements and the microcontroller of the PSoC™ device.

Figure 1B:
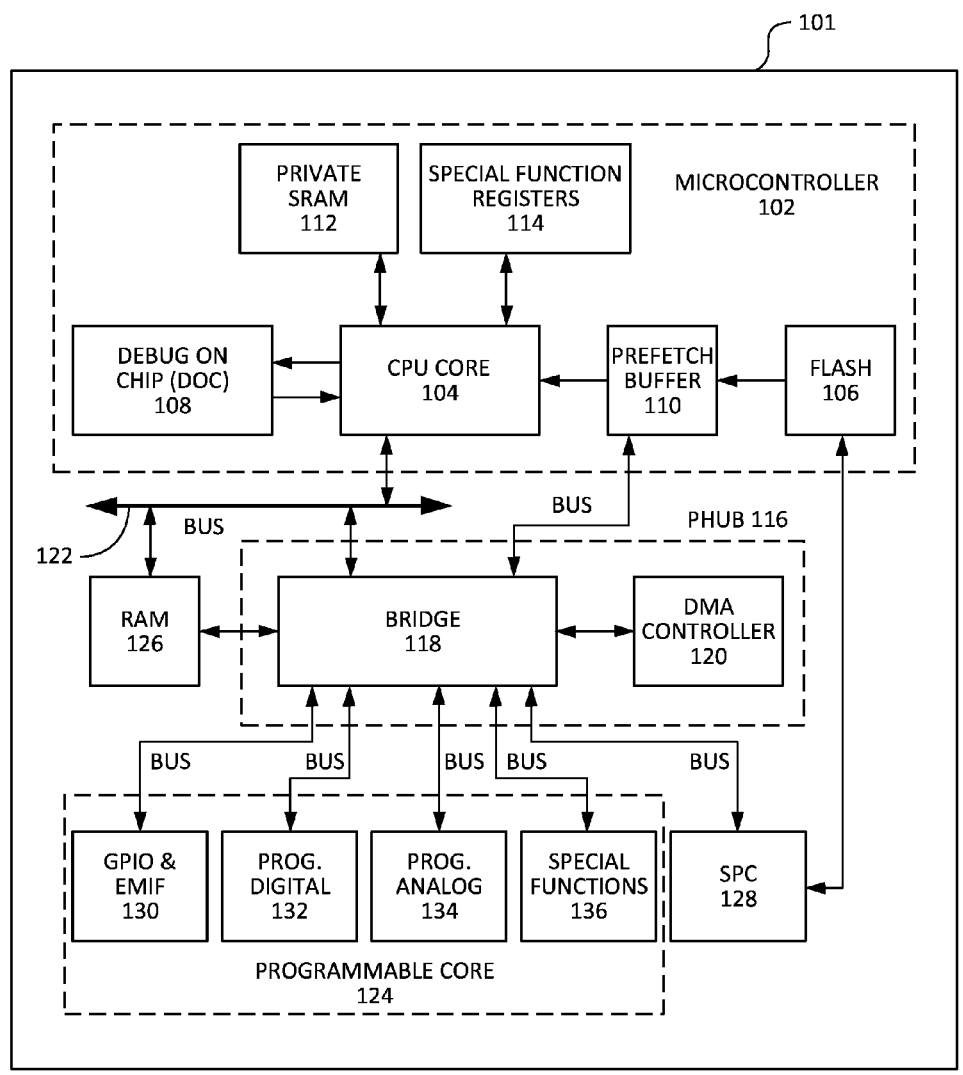
FIG. 1B is a block diagram illustrating an example programmable target device for which various embodiments may be implemented.

FIG. 1B illustrates an example embodiment of a programmable system-on-chip device 101. In some embodiments, a system-on-chip device (e.g., such as device 101) is manufactured as a set of integrated circuits on one chip of semiconductor material. Device 101 includes microcontroller 102. Microcontroller 102 includes CPU core 104 (which may include one or more processors), flash program storage 106, DOC (Debug-On-Chip) 108, prefetch buffer 110, private SRAM (Static Random Access Memory) 112, and special functions registers 114. In an embodiment, DOC 108, prefetch buffer 110, private SRAM 112, and special function registers 114 may be coupled to CPU core 104, while flash program storage 106 may be coupled to prefetch buffer 110. Flash program storage 106 can be any type of program memory.

Device 101 may also include PHub (Peripheral Hub) 116, which may include bridge 118 (e.g., such as a single-level or multi-level Advanced High-Performance Bus Bridge) and optionally a DMA (Direct Memory Access) controller 120 that is coupled to microcontroller 102 via bus 122. PHub 116 may provide the primary data and control interface between microcontroller 102 and its peripherals and memory, and programmable core 124. DMA controller 120 may be programmed to transfer data between system elements without burdening CPU core 104. In various embodiments, each of these subelements of microcontroller 102 and PHub 116 may be different with each choice or type of CPU core 104. PHub 116 may also be coupled to shared SRAM 126 and SPC (System Performance Controller) 128. Private SRAM 112 is independent of the shared SRAM 126, which is accessed by microcontroller 102 through bridge 118. CPU core 104 accesses the private SRAM 112 without going through bridge 118, thus allowing local register and RAM accesses to occur simultaneously with DMA access to shared SRAM 126. Although labeled here as SRAM, these memory modules may be any suitable type of a wide variety of (volatile or nonvolatile) memory or data storage modules in various other embodiments.

In various embodiments and implementations, programmable core 124 may include various combinations of subelements (not shown), including, but not limited to, global routing channels, digital processing channels, digital peripherals, analog processing channels, analog peripherals, DMA controller(s), SRAM and other appropriate types of data storage, IO ports, and other suitable types of subelements. In the example embodiment illustrated in FIG. 1A, programmable core 124 includes GPIO (General Purpose IO) and EMIF (Extended Memory Interface) block 130 to provide a mechanism to extend the external off-chip access of microcontroller 102, programmable digital array 132, programmable analog array 134, and special functions array 136, each configured to implement one or more of the subelement functions. In various embodiments, special functions array 136 may include dedicated (non-programmable) functional blocks and/or one or more interfaces to dedicated functional blocks, such as a USB, a crystal oscillator drive, a JTAG (Joint Test Action Group) interface, and the like.

Programmable digital array 132 may include an array of digital logic blocks and associated routing. In one embodiment, the digital block architecture is comprised of UDBs (Universal Digital Blocks). For example, each UDB may include an ALU (Arithmetic Logic Unit) together with CPLD (Complex PLD) functionality or other types of digital programmable logic functions.

In various embodiments, one or more UDBs of programmable digital array 132 may be configured to perform various digital functions, including, but not limited to, one or more of the following functions: a basic $I^2C$ slave; an $I^2C$ master; a SPI (Serial Peripheral Interface) master or slave; a multi-wire (e.g., 3-wire) SPI master or slave (e.g., MISO/MOSI multiplexed on a single pin); timers and counters (e.g., a pair of 8-bit timers or counters, a 16-bit timer or counter, a 8-bit capture timer, or the like); pulse-width modulators, or PWMs (e.g., a pair of 8-bit PWMs, a 16-bit PWM, a 8-bit deadband PWM, or the like); a level sensitive I/O interrupt generator; a quadrature encoder; an Universal Asynchronous Receiver/Transmitter, or UART (e.g., half-duplex); delay lines; and any other suitable type of digital function or combination of digital functions which can be implemented in one or more UDBs.

In other embodiments, additional functions may be implemented using a group of two or more UDBs. Merely for purposes of illustration and not limitation, the following functions may be implemented using multiple UDBs: an $I^2C$ slave that supports hardware address detection and the ability to handle a complete transaction without CPU core intervention and to help prevent the force clock stretching on any bit in the data stream; an $I^2C$ multi-master which may include a slave option in a single block; an arbitrary length cyclical redundancy check, or CRC (e.g., up to 32 bits); secure digital input/output, or SDIO; serial general purpose input/output, or SGPIO; a digital correlator (e.g., having up to 32 bits with 4× over-sampling and supporting a configurable threshold); a LIN (Local Interconnect Network) bus interface; a delta-sigma modulator (e.g., for class D audio DAC having a differential output pair); an integrated interchip sound, or $I^2S$ (stereo); a liquid crystal display, or LCD, drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support); a capture timer (e.g., 16-bit or the like); a deadband PWM (e.g., 16-bit or the like); a system management bus, or SMbus (including formatting of SMbus packets with CRC in software); a brushless motor drive (e.g., to support 6/12 step commutation); auto BAUD rate detector and generator (e.g., automatically determine BAUD rate for standard rates from 1200 to 115200 BAUD and after detection to generate required clock to generate BAUD rate); and any other suitable type of digital function or combination of digital functions which can be implemented in multiple UDBs.

Programmable analog array 134 may include analog elements including, but not limited to, comparators, mixers, operational amplifiers (opamps), PGAs (Programmable Gain Amplifiers), TIAs (Trans-Impedance Amplifiers), ADCs (analog-to-digital converters), DACs (digital-to-analog converters), voltage references, current sources, sample and hold circuits, analog interconnects (and switches thereof), and any other suitable type of analog elements and resources. Programmable analog array 134 may support various analog functions including, but not limited to, analog routing, LCD drive IO support, capacitive sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

In various embodiments, a programmable target device may include some, but not all, of the elements described above with respect to device 101 of FIG. 1B. Alternatively, or in addition to, in some embodiments a programmable target device may include different elements than the elements described above with respect to device 101 of FIG. 1B. For example, a programmable target device may include a peripheral interconnect in addition to, or instead of, a peripheral hub, where the peripheral interconnect may provide the primary data and control interface between a microcontroller and its peripherals, a memory, and a programmable core. In another example, a programmable target device may include a programmable digital array that is coupled to a digital system interface (DSI), which provides the digital blocks in the array with routable connectivity to a set of input/output (IO) pins. In another example, a programmable target device may include a programmable analog array that is coupled to an analog interface (AI), which provides analog elements of the array with routable connectivity to a set of IO pins. In another example, a programmable target device may include GPIO blocks that are coupled to a high-speed I/O (HSIO) matrix, which may provide the GPIO blocks with routable connectivity to a set of IO pins. In another example, a programmable target device may include a special functions array that is coupled to a HSIO matrix, which may provide the blocks (e.g., such as fixed-functions blocks) in the array with routable connectivity to a set of IO pins. Thus, programmable target device 101, and its architecture and elements described above with respect to FIG. 1B, are to be regarded in an illustrative rather than a restrictive sense.

Figure 2:
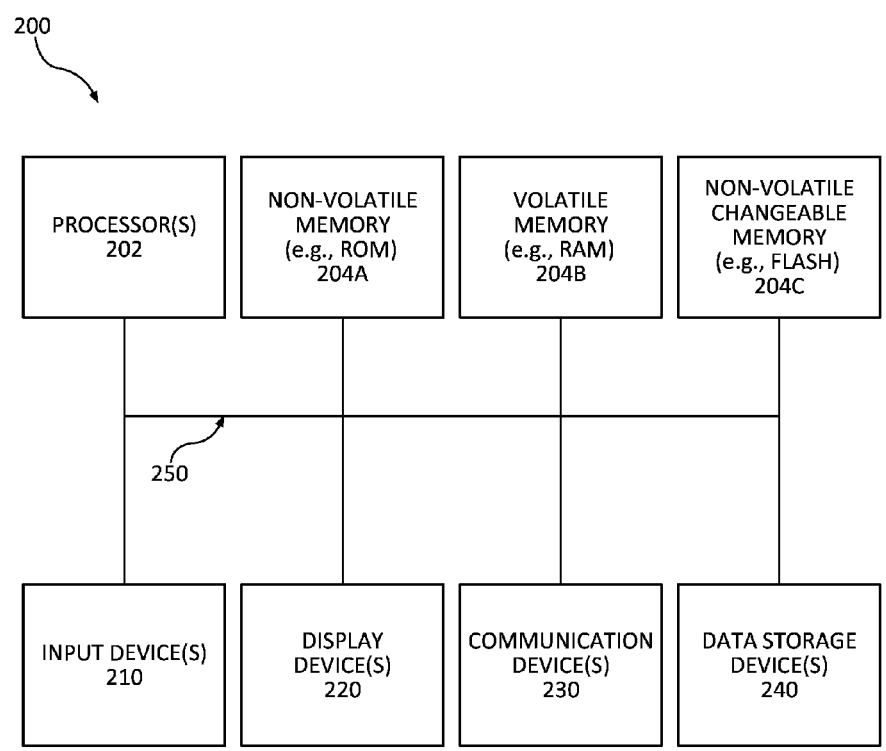
FIG. 2 is a block diagram illustrating an example computer system on which various embodiments may be implemented.

FIG. 2 illustrates basic hardware elements that may be included in computer system 200, which may form a hardware platform for executing an IDE logic or other EDA tools, according to example embodiments of the techniques for auto-routing described herein. Computer system 200 includes one or more address/data buses 250 for communicating data, one or more processors 202 functionally coupled with bus(es) 250 for processing data and executing instructions, non-volatile memory 204A (e.g., read-only memory, or ROM) coupled with bus(es) 250 for storing static data and instructions for processor(s) 202, and volatile memory 204B (e.g., random access memory, or RAM) coupled with bus(es) 250 for storing data and executable instructions for processor(s) 202. Computer system 200 may also include one or more system interfaces (not shown), and a changeable, non-volatile memory 204C (e.g., flash memory, EPROM, and the like) for storing data and/or firmware instructions for processor(s) 202 that can be replaced and/or updated after the manufacture of the computer system.

Computer system 200 may also include one or more input devices 210 and one or more display devices 220 that are coupled to processor(s) 202 over bus(es) 250. Input device(s) 210 may include an alphanumeric input device (e.g., such as a touch-sensitive or typewriter-style keyboard), a general pointing device that provides spatial input data (e.g., such as a computer mouse, trackpad, or equivalent device), and/or any other suitable human interface device that can communicate user commands and other user-generated information to processor(s) 202. Display device(s) 220 may include a liquid crystal display (LCD) device, cathode-ray tube (CRT) monitor, field emission device (FED, or "flat panel" CRT) device, light emitting diode (LED) display device, plasma display device, electro-luminescent display device, or any other display device suitable for creating graphic images and alphanumeric characters recognizable to the user.

Computer system 200 may also include one or more communication devices 230 and one or more data storage devices 240 that are coupled to processor(s) 202 over bus(es) 250. Communication device(s) 230 are configured to transmit and receive data to and from other computer systems and/or computing devices. For example, communication device(s) 230 may include a USB controller and bus for communicating with USB peripheral devices, a network interface card (NIC) for communicating over wired communication networks, and/or wireless network card that can implement a variety of wireless data-transmission protocols, for example IEEE 802.11 and/or Bluetooth. Data storage device(s) 240 are configured for persistently storing data and information that is used by computer system 200 and/or by its user(s). Data storage devices 240 may include persistent storage media of one or more types including, but not limited to, electromagnetic disks (e.g., hard disks), optical storage disks (e.g., CD-ROMs), magneto-optical storage disks, solid-state drives, USB flash drives, and the like.

Figure 3:
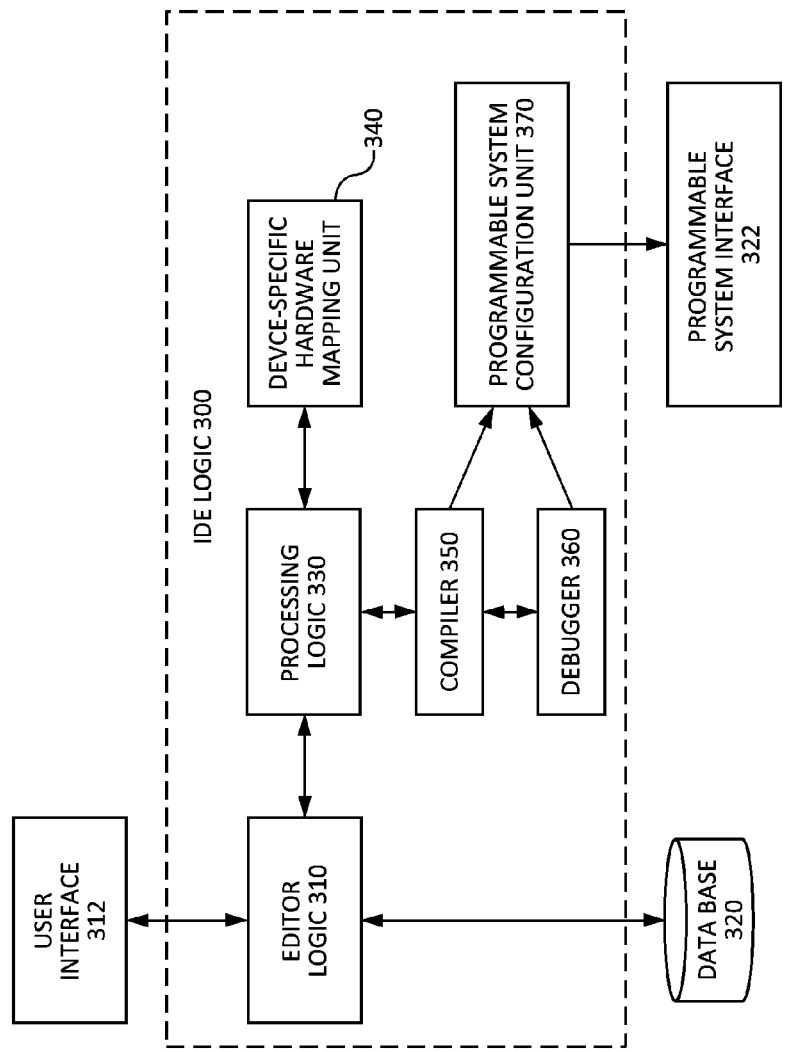
FIG. 3 is a block diagram illustrating an example integrated development environment that may be used to implement various embodiments.

FIG. 3 illustrates an example embodiment of an IDE logic (e.g., such as IDE logic 300 in FIG. 1A). One example of an IDE logic is the PSoC Designer software application (program) offered by Cypress Semiconductor Corporation of San Jose, Calif. Referring to the embodiment illustrated in FIG. 3, IDE logic 300 may be implemented as one or more modules that are stored in volatile or non-volatile memory and are executable by one or more computer systems. IDE logic 300 includes editor logic 310 to receive and edit schematics and information describing hardware circuitry. The information describing hardware circuitry can be received from various sources and in various formats, for example, through one or more user interfaces 312.

In some embodiments, a user interface (e.g., such as user interface 312 in FIG. 3) may include a graphical user interface (GUI). As used herein, "graphical user interface" and "GUI" refer to a structured set of graphical visual objects that are rendered by a computer system (or logic thereof) on a display device to convey graphical and/or textual information to a user, and to receive input data from the user. In some embodiments, a user interface may also include a command-line interface (CLI), which is a run-time process that is configured to receive textual information from a user and/or to display textual information in a display device. In some embodiments, a user interface and its GUI may be rendered on a display device by an editor logic and/or by another logic which, when executed by one or more computer systems, is configured to operate a display device. By way of illustration, a set of instructions for a GUI may comprise executable and/or interpretable instructions that are generated from one or more objected-oriented classes that implement the set of graphical visual objects of the GUI. Examples of graphical visual objects include, but are not limited to, windows, forms, tabs, menus, frames, toolbars, content panes, panels, dialog boxes, buttons, icons, pins, text fields/boxes, drop-down lists, list boxes, check boxes, combo boxes, tables, lists, labels, sliders, progress bars, scroll bars, status bars, tables, lines, arrows, and any other graphical objects that can visually represent, or otherwise convey, information in a GUI.

Editor logic 310 can include (and/or invoke) various development tools that present a user/designer with options for inputting circuit designs or descriptions thereof to IDE logic 300. For example, editor logic 310 can receive code written according to a hardware description language, such as Verilog or VHDL. Editor logic 310 can also provide a graphics-based circuit design application, such as a Schematic Editor, a Symbol Editor, etc., which allow designers and other users to create and edit schematics of the hardware circuitry to be implemented by a programmable target device (e.g., such as programmable target device 100 in FIG. 1A). In some embodiments, editor logic 310 can access database 320 to determine dependencies, build rules, and debug rules for the received descriptions of the hardware circuitry.

Editor logic 310 can also receive user-generated program code from user interface 312 or from other system interface. The program code can utilize at least one application programming interface generated by the IDE logic to communicate with the hardware elements in a programmable target device (e.g., such as programmable target device 100 in FIG. 1A). This program code can also include at least one application programming interface to allow a processor or a microcontroller in the programmable target device, when programmed with the code, to communicate with hardware elementss in the target device.

According to the techniques for auto-routing described herein, in some embodiments editor logic 310 may be configured to edit the schematic of an electronic design that is being opened, accessed, and/or edited by the editor logic. For example, editor logic 310 may be configured to display in user interface 312 a representation (e.g., diagram) of a programmable target device showing at least some of the components of the electronic design, and to receive, from a user through user interface 312, input data (e.g., such as keyboard input and/or pointing device input) that indicates a source component in the electronic design. In these embodiments, editor logic 310 may be further configured to search for and determine the available route(s) from the source component to one or more destination components, display in user interface 312 (e.g., overlaid on the diagram of the programmable target device) visual object(s) that indicate the destination component(s), receive user input that selects one of the destination component(s) (e.g., by indicating the endpoint of an available route), and store interconnect data (e.g., the configuration of a route) which indicates that a signal can be routed between the source component and the destination component in the programmable target device.

IDE logic 300 also includes processing logic 330, which may be configured to perform various functionalities. For example, processing logic 330 may be configured to generate configuration files from the received descriptions of the hardware circuitry and/or the schematic of an electronic design. In some embodiments, if some of the received descriptions of the hardware circuitry are in an abstracted or generic format, processing logic 330 may access a device-specific hardware mapping unit 340 to map these descriptions to the programmable digital and/or analog elements of a programmable target device. Further, processing logic 330 may also be configured to generate configuration files from device-specific version(s) of the hardware circuitry descriptions.

Processing logic 330 may also generate one or more application programming interfaces (APIs) from the received descriptions of the hardware circuitry. For example, an application programming interface, when provided to a programmable target device, can program one or more processors (or microcontrollers) and one or more interconnects to allow them to communicate with hardware elements of the target device.

As illustrated in FIG. 3, IDE logic 300 also includes a compiler 350 to compile the configuration files and/or the application programming interfaces and link them into executables and/or firmware code that can be loaded onto a programmable target device (e.g., such as programmable target device 100 in FIG. 1A). Once the configuration files and the application programming interfaces have been compiled and linked, compiler 350 can provide them to programmable system configuration unit 370 to send them to the programmable target device, for example, via a programmable system interface 322. The programmable target device can configure its programmable digital and/or analog arrays according to the configuration files and program its microcontroller and interconnect(s) according to the application programming interfaces in order to implement the hardware circuitry described by the user/designer.

Compiler 350 can also provide the configuration files and the application programming interfaces for debugger 360 (e.g., such as debug hardware 208 in FIG. 1A). Debugger 360 can perform debugging operations on the programmable target device that is configured with the configuration files and the application programming interfaces. For example, debugger 360 can perform step over, step into, and step out operations, which allows users the ability to perform incremental evaluations that step through programming code.

Various embodiments of the techniques for auto-routing described herein may be implemented as a computer program product that may include instructions stored on non-transitory computer-readable media, e.g., such as volatile storage and/or non-volatile storage. For example, a computer program product may include executable instructions that implement IDE logic 300, editor logic 310, and/or processing logic 330, as described above with respect to FIG. 3. These instructions may be used to program one or more computer systems or computing devices that include one or more general-purpose or special-purpose processors (e.g., CPUs) or equivalents thereof (e.g., such as processing cores, processing engines, microcontrollers, and the like). When executed by the processor(s) or the equivalents thereof, the instructions cause the computer system(s) or computing device(s) to perform the operations that comprise the techniques for auto-routing described herein. A non-transitory computer-readable medium may also include one or more mechanisms for storing or transmitting information in a form (e.g., software, processing application, etc.) that is readable by a machine (e.g., such as a computing device or a computer system). Such non-transitory computer-readable storage medium may include, but is not limited to, electromagnetic storage medium (e.g., floppy disks, hard disks, and the like), optical storage medium (e.g., CD-ROMs and the like), magneto-optical storage medium, read-only memory (e.g., ROM and the like), random-access memory (e.g., RAM and the like), erasable programmable memory (e.g., EPROM, EEPROM, and the like), flash memory, or another now-known or later-developed type of medium that is suitable for storing information and/or executable instructions.

Additionally, some embodiments of the techniques described herein may be practiced in distributed computing environments where the computer-readable medium is stored on, and/or executed by, more than one computing device or computer system. One example of such distributed computing environment is a client-server environment where some of the various functionalities of the techniques described herein may be performed by a client computer system and/or some of the functionalities may be performed by a server computer system. Another example of such distributed computing environment is a cloud computing environment. In a cloud computing environment, computing resources are provided and delivered as a service over a network such as a local-area network (e.g., LAN) or a wide-area network (e.g., the Internet). Examples of cloud-based computing resources may include, but are not limited to: physical infrastructure resources (e.g., physical computing devices or computer systems, and virtual machines executing thereon) that are allocated on-demand to perform particular tasks and functionalities; platform infrastructure resources (e.g., an operating system or OS, programming language execution environments, database servers, web servers, and the like) that are installed/imaged on-demand onto the allocated physical infrastructure resources; and application software resources (e.g., application servers, single-tenant and multi-tenant software platforms, and the like) that are instantiated and executed on-demand in the environment provided by the platform infrastructure resources. In various distributed computing environments, the information transferred between the various computing devices and/or computer systems may either be pulled or pushed across the transmission medium connecting the computing devices and/or computer systems.

Figure 4:
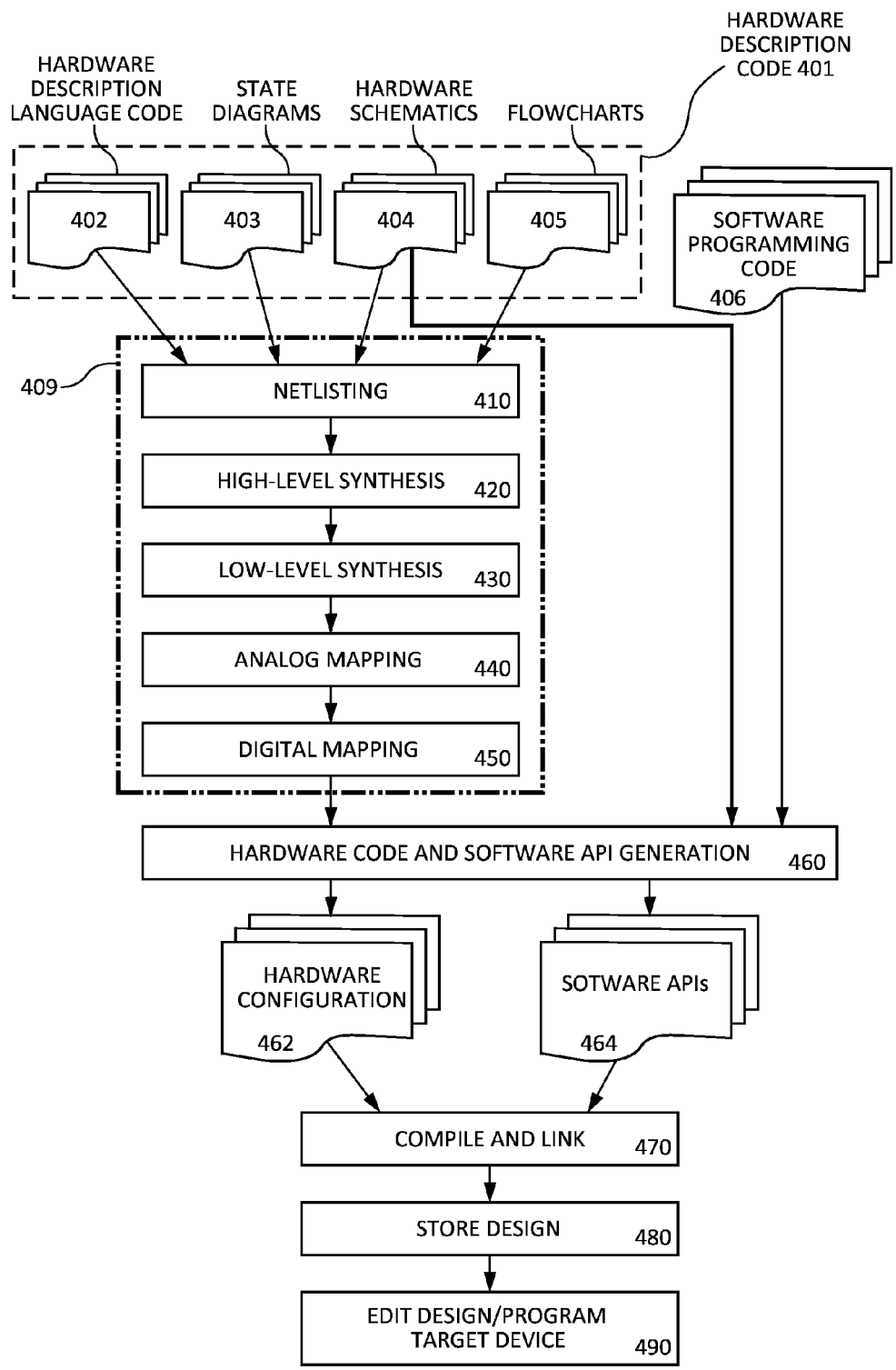
FIG. 4 illustrates a design automation flow according to an example embodiment.

FIG. 4 is a diagram illustrating a design automation flow according to one embodiment. The various steps of the flow in FIG. 4 are described hereinafter as being performed by an editor logic, a processing logic, a compiler, and a debugger (e.g., such as editor logic 310, processing logic 330, compiler 350, and debugger 360 of FIG. 3) that are executed by one or more computer systems. It is noted, however, that various implementations and embodiments may use different, and possibly multiple, modules to perform the operations of the flow in FIG. 4. For example, in various embodiments such modules may be implemented in a single integrated module or their functionality may be spread across two or more modules that may perform some additional operations and functionalities. Thus, the description hereinafter of the flow in FIG. 4 is to be regarded in an illustrative rather than a restrictive sense.

Referring to FIG. 4, the editor logic receives hardware description code 401, such as hardware description language code 402, state diagrams 403, hardware schematic(s) 404, and flowcharts 405, which describe the hardware circuitry of an electronic design. The hardware circuitry can include one or more circuits to perform various applications/functions and analog and/or digital signal routing associated with the circuits. Hardware description language code 402 can be written in Verilog, VHDL, or other similar hardware description language.

Hardware schematics 404 can be schematic diagrams of the hardware circuitry of the electronic design that are created with the editor logic or with a separate graphics-based circuit design application, such as a Schematic Editor, a Symbol Editor, etc. According to the techniques for auto-routing described herein, the editor logic is configured to receive user input that edits the electronic design. For example, the editor logic may be configured to display in a user interface a diagram of a programmable target device showing at least some of the components of the electronic design, and to receive, from a user through the user interface, input data (e.g., such as keyboard input and/or mouse input) that indicates a source/start component in the electronic design. The editor logic may be further configured to search for and determine the available route(s) from the source/start component to one or more destination/end components, display in the user interface (e.g., overlaid on the diagram of the programmable target device) visual object(s) that indicate the destination component(s), receive user input that selects one of the destination component(s) (e.g., by indicating the endpoint of an available route), and store interconnect data (e.g., the configuration of a route) which indicates that a signal can be routed between the source component and the destination component in the programmable target device. In this manner, the techniques described herein allow a user/designer to perform block and connection placement during the editing phase of the electronic design.

In some embodiments, after performing block and connection placement in this manner, the editor logic may pass the hardware description code 401 (and any information generated as part of auto-routing) to a processing logic for hardware code and software API generation as described below with respect to block 460. In some embodiments, if some portion of the hardware description code 401 is in an abstracted or generic format or if not all components of the electronic design are placed through auto-routing as described above, the editor logic may pass the hardware description code or a portion thereof to the processing logic for further automatic mapping and placement, as indicated by the operations included in block 409.

For example, in step 410 the processing logic may perform netlisting of hardware description language code 402, state diagrams 403, and/or flowcharts 405, to generate a single representation (e.g., such as a netlist) of the hardware circuitry of the electronic design that is to be implemented by a programmable target device (e.g., such as programmable target device 100 of FIG. 1A). For example, as part of netlisting, the processing logic can combine and integrate the circuitry descriptions, which may have various formats, into a single netlist that represents the entire hardware circuitry. In doing so, the processing logic takes into account (e.g., by excluding from the netlist) any components of the electronic design that have already been placed and routed through auto-routing during the editing phase as described above.

In step 420, the processing logic may perform high-level synthesis on the netlist generated in step 410 for the hardware description code. As part of the high-level synthesis, the processing logic breaks down (e.g., reduces) the netlisted hardware description code into lower level analog and digital primitives, logic equations, flip-flops, and/or other low-level hardware elements, and stores the reduced description code in (or in association with) the corresponding netlist.

In step 430, the processing logic may map the reduced hardware description code in the netlist to the programmable target device through low-level synthesis. As part of the low-level synthesis, the processing logic: (1) determines which hardware resources or physical elements within the programmable target device (e.g., such as elements in programmable analog arrays and/or programmable digital arrays) can implement the circuitry components described by the reduced hardware description code in the netlist; and (2) stores in (or in association with) the netlist a mapping that associates instances representing the components with the corresponding hardware elements and resources of the programmable target device.

In steps 440 and 450, the processing logic may map the analog and digital blocks and components of the electronic design (as specified in the reduced description code of the netlist generated in step 410) to the hardware elements and resources of the programmable target device. For example, as part of the operations in steps 440 and 450, the processing logic determines the locations where the analog and digital circuitry is to be placed in the programmable analog array(s) and the programmable digital array(s), respectively, of the target device. Further, the processing logic may also allocate or set the analog signal routing and digital signal routing for the hardware circuitry of the electronic design, for example, by specifying and storing the state (e.g., open or closed) of any switches that are part of the analog interconnect(s) and the digital interconnect(s) of the target device.

In step 460, the processing logic generates hardware configuration files 462 and application programming interfaces 464. For example, the processing logic generates hardware configuration files 462 based on the auto-routing performed for hardware schematics 404 during the editing phase and, if applicable, based on the mappings generated in steps 440 and 450. The processing logic generates application programming interfaces 464 based on software programming code 406 received from at least one system interface, and possibly based on the auto-routing performed for hardware schematics 404 during the editing phase and on the mappings generated in steps 440 and 450. Software programming code 406 may include at least one application programming interface to allow a processor or a microcontroller in the programmable target device, when programmed with the software programming code, to communicate with hardware resources and physical elements in the target device.

In step 470, a compiler compiles and links application programming interfaces 464 into executable code (e.g., such as firmware), and also compiles and/or otherwise prepares hardware configuration files 462 for loading to the programmable target device (e.g., in the form of firmware configuration). After step 470 is completed, a representation of the electronic design specified in hardware description code 401 can be programmed into a target device to implement the functionalities and operations defined in the design.

In step 480, the compiler (or other logic such as the processing logic) stores the implemented electronic design into persistent storage. In various embodiments, an electronic design may be stored in any suitable storage media and in any suitable data structures or formats. Examples of suitable storage media include, but are not limited to, various volatile and/or non-volatile computer-readable storage media as described heretofore. Examples of suitable data structures and formats include, but are not limited to, one or more files (e.g., such as design project files), one or more data records (e.g., records stored in relational, hierarchical, or object-oriented databases), one or more sets of data objects instantiated from object-oriented classes, and/or any other suitable structured data arrangements that can store persistent or in-memory data.

In step 490, the compiler (or other logic such as the editor and/or processing logic) may send the compiled and linked hardware configuration files 462 and application programming interfaces 464 to the programmable target device. In this manner, the programmable target device (e.g., such as programmable target device 100 in FIG. 1A) is configured to implement the hardware circuitry of the electronic design (e.g., as defined in hardware description code 401) responsive to the hardware configuration files and the application programming interfaces. Alternatively, or in addition to, in step 490 the editor logic may access and/or open a stored electronic design for further editing that is initiated by a user/designer. Finally, in step 490 a debugger may also execute a debugging application to debug the programmable target device when any issues are found or when a design (or a re-design) needs to be tested.

III. Example Techniques for Auto-Routing

In some embodiments, the techniques for auto-routing described herein are performed with respect to the same, single user interface view. As used herein in reference to a user interface and a GUI, "view" refers to a graphical visual object having a boundary that surrounds, or otherwise delimits, a certain area on a display device. Examples of user interface/GUI views include, but are not limited to, application windows, tabs, panels, panes, forms, and similar 2-D and 3-D visual objects.

For example, in some embodiments an editor logic may display a diagram of a programmable target device in a GUI view. According to the techniques for auto-routing described herein, the editor logic may be configured at least to: (a) receive, in the same GUI view, user input that indicates a source component in an electronic design for the programmable target device; (b) display, in the same GUI view and overlaid on the target device diagram, visual object(s) that indicate other component(s) of the design that can be routed to the source component; and (c) receive, in the same GUI view, user input that selects one of the visual object(s) corresponding to a destination component, thereby indicating that the destination component is routed to the source component. In this manner, the auto-routing technique allows a user/designer to connect components of an electronic design directly to other components of the design without any manual routing steps and without having to switch to a different user interface (or GUI) view. By way of illustration, in order to route a signal from a block output/input to a pin or a routing resource, the user/designer needs to press a keyboard button and choose (e.g., mouse-click) a source component (point A) and destination component (point B) in the same GUI view, where in response to the user clicking on point A the editor logic finds all possible/available routes from point A and highlights in the same GUI view the destination points of these routes, and where in response to the user clicking on point B the editor logic automatically configures a route between the source component and the destination component.

In some embodiments, the techniques for auto-routing to/from blocks (also referred to as block components) in an electronic design are available to the user/designer when the blocks are already placed with respect to the programmable target device and have valid inputs or outputs, where pins which have signals already assigned to other blocks or routing resources are not available for connection and are not highlighted in the GUI view. For example, a block is considered to be placed when there is a mapping that associates the block with one or more identified hardware elements, primitives, or other physical resources of the programmable target device. Such mapping may be implemented as a set of data, as one or more records in a database, as one or more entries on a list, as a name-value pair, as an object-oriented class instance, as a set of ordered values, and as any other suitable data object that can store or represent data; in operation, a data object may be stored on volatile and/or non-volatile media.

In some embodiments, the techniques for auto-routing described herein may be implemented for the following electronic design components:
digital block output to pin or to digital block input;
digital block input to pin or to digital block output;
pin to digital block input or to digital block output;
routing resource to pin or to digital block (e.g., such as routing from comparator bus resource to block input/output);
analog block output to analog block input or to routing resource;
analog block input to analog block, pin or routing resource.
As used herein, "pin" refers to a design component that represents a terminal of a programmable device though which the device can be coupled to off-device elements and can receive and transmit signals into and out of on-device elements. For example, a pin typically corresponds to an electrically connectable terminal of a programmable chip, on the chip's package, that is wired (e.g., on a printed circuit board, or PCB) to get signals to and from the chip. A set of one or more pins on a device is referred to as a "port". "Block" refers to a design component that represents a set of one or more hardware elements or primitives that are configured to perform a given functionality during the operation of a programmable device, where the functionality of a "digital" block is performed by processing digital signals and the functionality of an "analog" block is performed by processing analog signals. "Routing resource" refers to a design component that represents a set of one or more hardware elements or primitives (e.g., such as switches, multiplexers, buses, and other interconnect elements) across which a digital or analog signal can travel during the operation of a programmable device.

Figure 5:
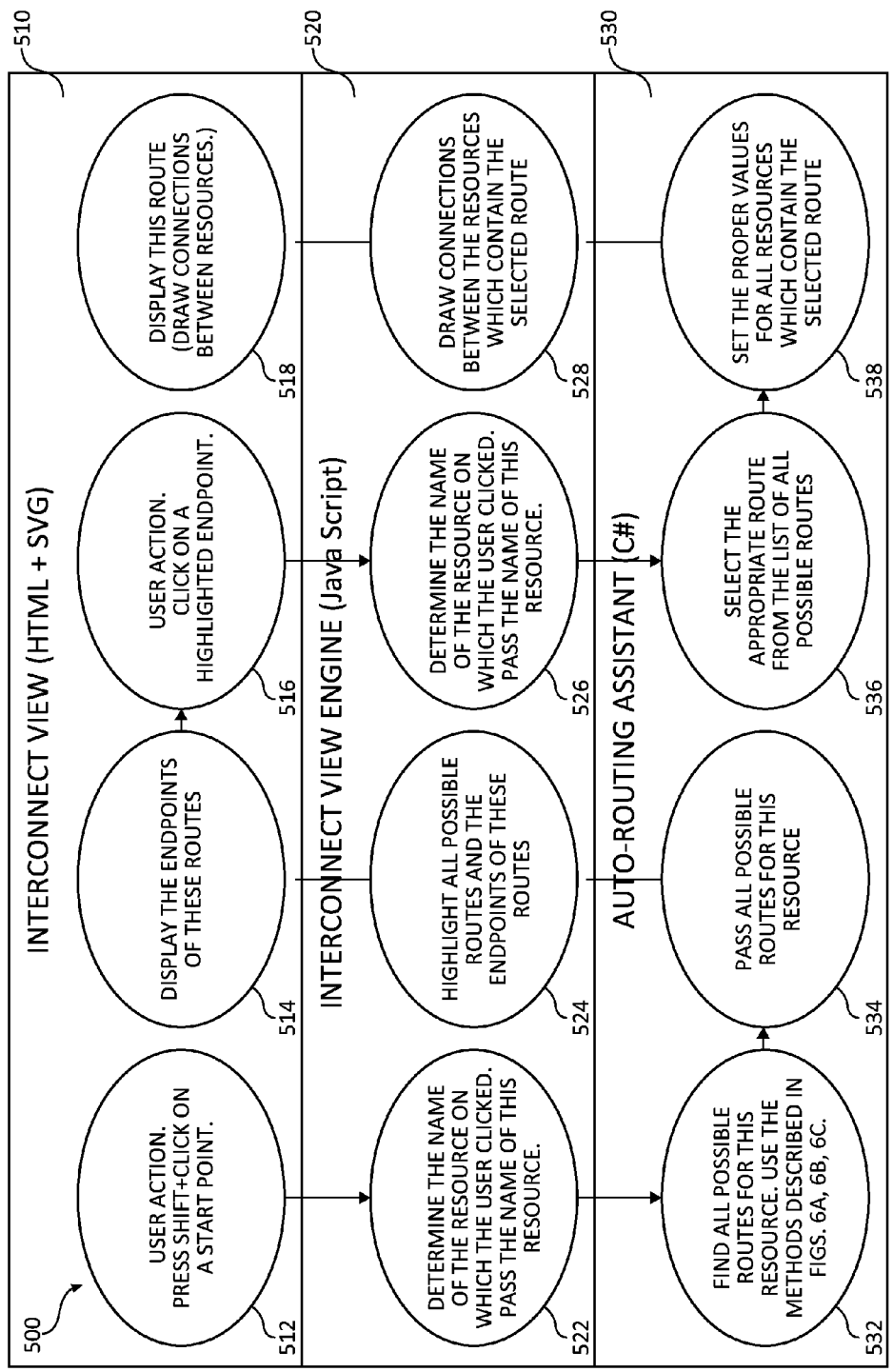
FIG. 5 is a flow diagram illustrating an example method for auto-routing according to one embodiment.

FIG. 5 is a flow diagram illustrating an example method for performing an auto-routing feature 500 according to the techniques described herein. The operations in the steps of FIG. 5 are described hereinafter as being performed by editor logic that is executed by one or more computer systems. It is noted, however, that various implementations and embodiments may use different, and possibly multiple, modules to perform the method of FIG. 5. For example, in various embodiments such modules may be implemented in a single integrated module or their functionality may be spread across two or more modules that may perform some additional operations and functionalities. Thus, the description hereinafter of the method in FIG. 5 is to be regarded in an illustrative rather than a restrictive sense.

In some embodiments, the auto-routing feature 500 may be implemented by editor logic having a layered architecture that may include, for example, an interconnect view logic 510, an interconnect view engine 520, and an auto-routing assistant logic 530. In such embodiments, interconnect view logic 510 may be configured and operable to execute code or other instructions that display and/or render graphical and text images on a display device through a software application GUI, web browser GUI, or any other suitable GUI. The code or instructions that are included in interconnect view logic 510 may be written in one or more markup languages (e.g., such as a HyperText Markup Language (HTML), a Scalable Vector Graphics (SVG) language, and the like), one or more scripting languages (e.g., such as Perl, Tcl/Tk, and the like), and/or one or more traditional or object-oriented programming languages (e.g., such as C, C++, C#, Visual Basic, Java, and the like).

In some embodiments, interconnect view engine 520 may be configured and operable to execute code or other instructions that receive user input through a GUI on a display device, return information to be displayed on a GUI of a display device, and/or otherwise support operations that allow interactions with a user through a software application GUI, web browser GUI, or any other suitable GUI. The code or instructions that are included in interconnect view engine 520 may be written in one or more scripting languages (e.g., Perl, JavaScript, and the like) and/or one or more traditional or object-oriented programming languages (e.g., such as C, C++, C#, Visual Basic, Java, and the like) that allow for GUI-based and/or CLI-based user interactions.

In some embodiments, auto-routing assistant logic 530 may be configured and operable to execute code or other instructions that determine and configure routes and other connections in electronic designs for programmable target devices in accordance with the techniques described herein. The code or instructions that are included in auto-routing assistant logic 530 may be written in one or more scripting languages (e.g., Perl, JavaScript, and the like) and/or one or more traditional or object-oriented programming languages (e.g., such as C, C++, C#, Visual Basic, Java, and the like).

Referring to the example embodiment in FIG. 5, in step 512 the editor logic receives user input in a user interface, where the user input indicates a start component that has been placed with respect to a programmable target device. The user input is caused by a user action such as, for example, pressing and holding of the "Shift" keyboard key while simultaneously clicking on a mouse button. It is noted, however, that in various embodiments various combinations of keyboard input and/or mouse input may be used to activate (or otherwise request) performance of the auto-routing feature 500 for the user-selected start component. For example, some embodiments may use a combination involving one or more keyboard keys with a "Left Click" (e.g., a click on the left mouse button), while other embodiments may use a "Right Click" (e.g., a click on the right mouse button) instead. Some embodiments may use combinations involving only keyboard input such as, for example, various combinations involving the "Shift" key, "Ctrl" key, "Alt" key, and/or any other letter or special function key. Some embodiments may use combinations that involve single and/or double mouse clicks, while other embodiments (e.g., which have touch-screen or virtual keyboards) may have designated icons, buttons, or other visual objects that can activate performance of the auto-routing feature 500. Thus, the examples of keyboard input and/or mouse input activation combinations described herein are to be regarded in an illustrative rather than a restrictive sense.

In step 522, the editor logic determines the identity of the start component indicated by the received user input. For example, an appropriate routine in interconnect view engine 520 may process the user action received in step 512 to determine the ID (e.g., name) of the start component. The routine then passes the ID of the start component to the appropriate routine in auto-routing assistant logic 530 for further processing.

In step 532, the editor logic finds all possible routes (routings) for the start component identified in step 522. For example, the appropriate routine in auto-routing assistant logic 530 may receive the ID (e.g., name) of the start component and may use this ID to search for the available routes for the start component by using the methods described below with respect to FIGS. 6A-6C. An "available" or "possible" route for the start component is a route which is not used by other components and/or which can be configured to carry a digital or analog signal to/from the start component during operation of the programmable target device. The editor logic (or a routine thereof) may determine such available routes based on the ID of the start component by searching storage structures (e.g., databases, files, and the like) that store data representing the components of the electronic design and the hardware elements and routing resources of the programmable target device, including any components that have been already placed and any routing resources that have already been assigned thereto.

In step 534, the editor logic passes the list of possible routes to the appropriate routine of interconnect view engine 520 for further processing. For example, a routine in auto-routing assistant logic 530 may pass information identifying each of the possible routes, where such information may include IDs of the endpoint components (or endpoints) of these routes as well as any other relevant route information.

In step 524, the editor logic highlights the endpoints of the possible routes and otherwise prepares the endpoints for display to the user/designer. For example, an appropriate routine in interconnect view engine 520 may process the received information for the possible routes and may prepare for rendering visual objects that identify the possible routes and/or the endpoints thereof.

In step 514, the editor logic displays the possible routes for the start component to the user/designer. For example, an appropriate routine in interconnect view logic 510 may render in the user interface one or more visual objects that identify the possible routes for the user-selected start component and/or the endpoints of these routes. Examples of such visual objects may include lines, boxes, and various colors that can sufficiently highlight to the user/designer all possible components in the electronic design to which the start component can be connected and/or routed. Thereafter, the editor logic prompts for, and/or waits, for subsequent user input that selects one of the possible routes.

In step 516, the editor logic receives user input in the user interface, where the user input selects an endpoint component from one of the highlighted possible routes. The user input is caused by a user action such as, for example, clicking on a mouse button. In step 526, the editor logic determines the identity of the endpoint component selected by the user input. For example, an appropriate routine in interconnect view engine 520 may process the user action received in step 516 to determine the ID (e.g., name) of the endpoint component. The routine then passes the ID of the endpoint component to the appropriate routine in auto-routing assistant logic 530 for further processing.

In step 536, the editor logic selects the route corresponding to the user-selected endpoint component from the list of possible routes for the start component. For example, a routine in auto-routing assistant logic 530 may retrieve information identifying the selected route, where such information may include the ID of the user-selected endpoint component as well as any other relevant route information (e.g., such as the identities of global and/or local interconnects and the identities and configurations of any switches, multiplexers, busses, hubs and other included routing resources).

In step 538, the editor logic configures the selected route between the start component and the endpoint component by setting the appropriate interconnect data for the route. As used herein, "interconnect data" refers to data indicating the configuration and states (e.g., open or closed) of routing resources (e.g., switches, multiplexers, hubs, busses, etc.) along a route that can be traversed by a signal during the operation of a programmable target device. For example, an appropriate routine in auto-routing assistant logic 530 may store the configuration of the selected route by specifying and storing the states (e.g., open or closed) of any switches and other hardware elements and routing resources that form the selected route. Further, as part of the configuration of the selected route, the same or different routine may generate (or otherwise initialize) software/firmware code that is operable to control the routing resources along the route during operation of the programmable target device. For example, such software/firmware code may be embodied in an API or firmware that is installed and executed during operation on the programmable target device to dynamically control which switch(es) of which interconnect(s) are open (and/or which are closed), thereby controlling the signals traversing the selected route between the start component and the endpoint component.

In step 528, the editor logic draws the selected route and/or its start and endpoint, and otherwise prepares the selected route for display to the user/designer. For example, an appropriate routine in interconnect view engine 520 may process the information for the selected route and may prepare for rendering visual objects that identify the selected route and/or its start component and endpoint component.

In step 518, the editor logic displays the selected route and/or its start component and endpoint component to the user/designer. For example, an appropriate routine in interconnect view logic 510 may render in the user interface one or more visual objects that identify the selected route and/or its start component and endpoint component, where such visual objects may include, without limitation, lines, boxes, and various colors that can sufficiently highlight the selection to the user/designer.

In some embodiments, to auto-route a signal from a block output to a block input or to a pin, the user/designer may press a designated keyboard button (e.g., the "Shift" key) and then click on the start block output. After the start block output is clicked on, the appropriate logic finds all possible routes for the selected block output and highlights them. To complete the desired route, the user/designer clicks on the destination of the route. In this operation, the available design components (to be connected from the start block output) include both clock-generating block components and data-processing block components. In some embodiments, routing connections of block outputs to multiple block inputs or pins may be allowed. For example, when the user/designer presses the designated keyboard button (e.g., "Shift" key) and clicks on a block output with an existing route, the appropriate logic highlights the remaining available block inputs and pins. To complete the desired route, the user/designer clicks on one of these block inputs or pins. In some embodiments for certain programmable target devices, auto-routing from a block output to inputs of other blocks may be completed through a local/horizontal bus or through a dedicated broadcast bus.

Figure 6A:
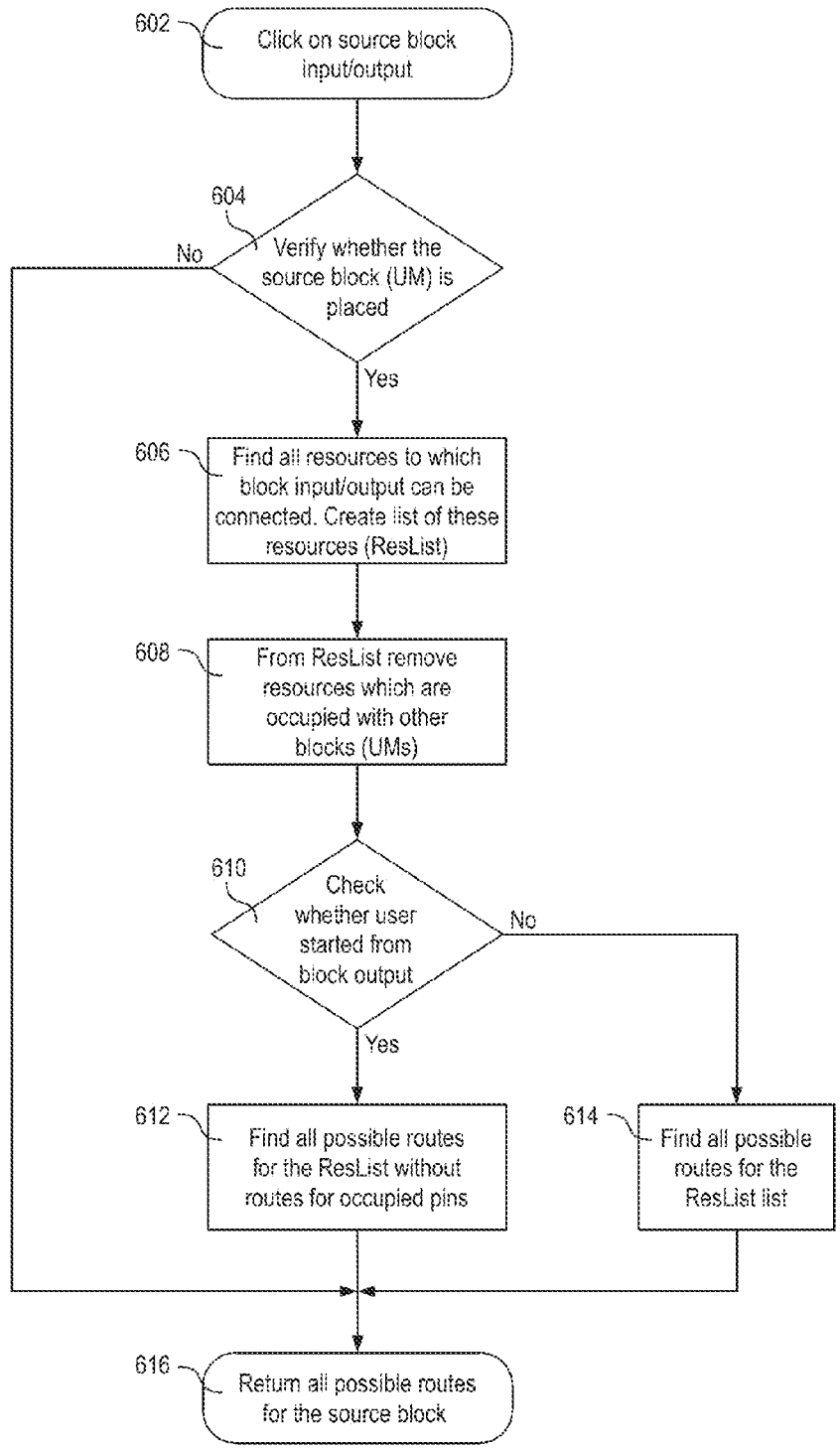
FIG. 6A is a flow diagram illustrating an example method for finding the available routes starting from a block component according to one embodiment.

FIG. 6A is a flow diagram illustrating an example method for finding the possible routes starting from a block component in accordance with the auto-routing techniques described herein. The operations in FIG. 6A are described hereinafter as being performed by editor logic that is executed by one or more computer systems. It is noted, however, that various implementations and embodiments may use different, and possibly multiple, components to perform the method of FIG. 6A. For example, in various embodiments such components may be implemented in a single integrated component or their functionality may be spread across two or more components that may perform some additional operations and functionalities. Thus, the description hereinafter of the method in FIG. 6A is to be regarded in an illustrative rather than a restrictive sense.

In step 602, the editor logic receives user input that selects a source/start block component in an electronic design that is being placed on a certain programmable target device. The source block component may be a digital block component or an analog block component, and the user input may indicate an input terminal or an output terminal of the source block component. For example, in some embodiments the editor logic may receive, trough a user interface, a mouse click on a device diagram location that is displayed on the user interface, where the source block component has been placed on the diagram location. The mouse click may be received separately from, or concurrently with, additional input such as, for example, keyboard input in the form of a pressed keyboard key.

In response, in step 604 the editor logic verifies whether the selected source block component (e.g., such as a User Module, or UM) is placed. By way of illustration, the editor logic may verify whether there is a mapping that associates the source block component with the location on the diagram of programmable target device on which the user clicked, where the location is associated with certain identifiable hardware element(s), primitive(s), or other physical resource(s) of the device. For example, in some embodiments all of the locations of a programmable target device, on which design block components can be placed, may be shown on a placement view of a GUI that shows a diagram of the device. Then, auto-routing for a given location on the placement view is enabled by the editor logic only when a block component (e.g., such as a UM) is assigned to the given location. Alternatively, the editor logic may determine the identity of the given location and may then search a data store to determine whether the given location is mapped to a valid block component. If in step 604 the editor logic determines that the user/designer clicked on a location on which a source block component has not been placed, the logic continues with the operations in step 616 and returns an empty list of possible routes to which the selection by the user/designer can be routed. Otherwise, if in step 604 the editor logic determines that the user/designer clicked on a "busy" location on which a source block component has been placed, the logic continues with the operations in step 606.

In step 606, the editor logic finds all design components to which the selected source block component can be connected and creates a list of these components (e.g., a resource list, or ResList). By way of illustration, the editor logic may traverse a data source of all available design components and may check whether the selected source block component (and/or its terminal input/output) can connect through local/horizontal interconnects and/or global/vertical interconnects to various pins and output/input terminal(s) of other block component(s). The result of the traversal may be a list of design components, where the list may be stored as any suitable data structure such as, for example, an array, a table, a set of name-value pairs, and the like. In some embodiments, the data source may be a set of eXtensible Markup Language (XML) documents, where a separate XML document may store the structural properties and parameters of each block component and pin used in the electronic design. In addition, an XML document for a given design component may also store a mapping that assigns this design component to a location of the programmable target device that has hardware elements, primitives or other physical resources. Thus, in order to find the available routing and other resources from the selected source block component, in these embodiments the editor logic may search the set of XML documents and may identify those design components to which the source block component may be routed. It is noted that various embodiments may use various types of data stores other than XML documents; such data stores may include, without limitation, databases (e.g., relational, hierarchical, object-oriented, etc.), sets of files (e.g., in proprietary or open formats), and any other suitable persistent and in-memory data structures.

In step 608, the editor logic prunes out from the list of design components (ResList) any design components that have already been assigned, connected, occupied, or otherwise used in the electronic design. By way of illustration, the editor logic may cross-check the design components on the list (ResList) against a data store to determine which design components have already been routed and connected to, and to remove from the list (ResList) any such design components. For example, if some block component has already been routed to pin "1" on port "3", the editor logic removes this pin from the list of design components (ResList) for the source block component which the user/designer selected.

In step 610, the editor logic checks whether the user/designer clicked on an output terminal of the selected source block component. If the user/designer clicked on an output terminal of the selected source block component, then in step 612 the editor logic finds all possible routes from the source block component to each design component (e.g., block component or pin) on the list of design components (ResList) except for routes leading to occupied pin(s). By way of illustration, the editor logic may traverse configuration data for the various local and global interconnects in the programmable target device. Such configuration data may indicate, for example, which switches of which interconnects are open (and/or which switches are closed) during various operations performed by the programmable target device, thereby allowing the editor logic to determine which route(s) between the source block component and any other design component(s) can be traversed by a signal.

If in step 610 the editor logic determines that the user/designer did not click on an output terminal of the selected source block component, then in step 614 the editor logic finds all possible routes from the source block component to each design component (e.g., block component or pin) on the list of design components (ResList). By way of illustration, the editor logic may traverse configuration data for the various local and global interconnects in the programmable target device and may determine which route(s) between the source block component and any other design component(s) can be traversed by a signal.

In step 616, the editor logic combines the routes identified in steps 612 and 614 into a list that represents all possible routes for the selected source block component. By way of illustration, the editor logic may determine the interconnect data for each identified route, and may store such interconnect data into the list of all possible routes for the selected source block component. The editor logic then returns (or sends) the list of all possible routes for further processing (e.g., such as processing in accordance with the operations in steps 534 and/or 524 of FIG. 5).

In some embodiments, to auto-route a signal from a pin to a block input or a block output, the user/designer may press a designated keyboard button (e.g., the "Shift" key) and then click on the desired start pin. After the start pin is clicked on, the appropriate logic finds all possible routes from the selected start pin to any block inputs and block outputs. To complete the desired route, the user/designer clicks on the destination of the route. In some embodiments, one and the same start pin can be shared by routes to several block inputs.

Figure 6B:
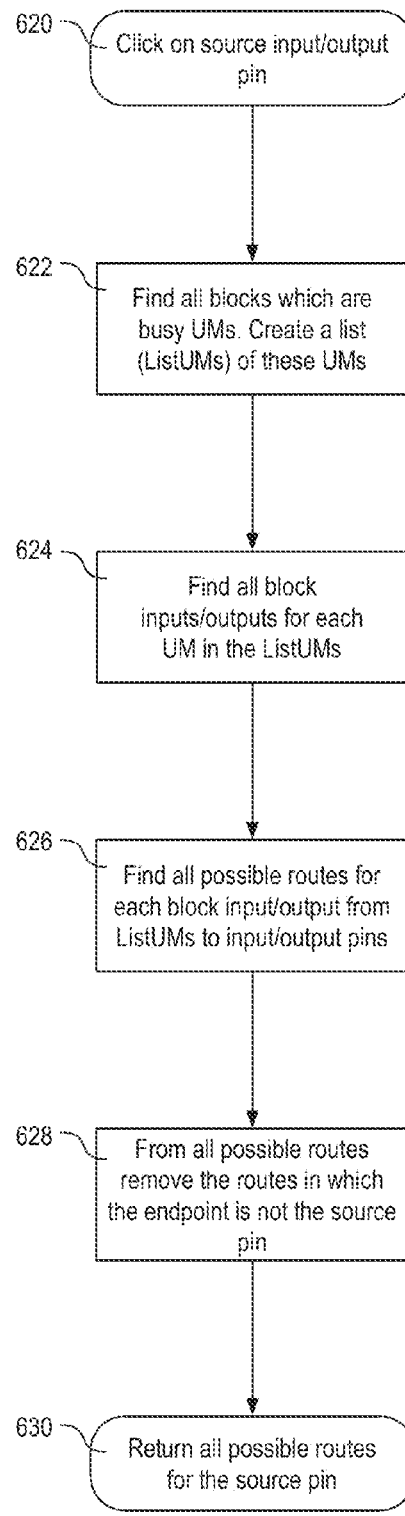
FIG. 6B is a flow diagram illustrating an example method for finding the available routes starting from a pin according to one embodiment.

FIG. 6B is a flow diagram illustrating an example method for finding the available routes starting from a pin in accordance with the auto-routing techniques described herein. The operations in FIG. 6B are described hereinafter as being performed by editor logic that is executed by one or more computer systems. It is noted, however, that various implementations and embodiments may use different, and possibly multiple, components to perform the method of FIG. 6B. For example, in various embodiments such components may be implemented in a single integrated component or their functionality may be spread across two or more components that may perform some additional operations and functionalities. Thus, the description hereinafter of the method in FIG. 6B is to be regarded in an illustrative rather than a restrictive sense.

In step 620, the editor logic receives user input that selects a source/start pin in an electronic design that is being placed on a certain programmable target device. For example, in some embodiments the editor logic may receive, trough a user interface, a mouse click on a device diagram location which is displayed on the user interface and which represents an input or output pin of the programmable target device. The mouse click may be received separately from, or concurrently with, additional input such as, for example, keyboard input in the form of a pressed keyboard key.

In response, in step 622 the editor logic finds all block components (e.g., such as UMs) of the electronic design that have been placed on locations of the programmable target device, and creates a list of these components (e.g., a list of UMs, or ListUMs). By way of illustration, the editor logic may search a data store to determine which block components represented therein are mapped to locations, on the programmable target device, that are associated with identifiable hardware element(s), primitive(s), or other physical resource(s) of the device. In various embodiments, a data store may be implemented as a set of XML documents, as one or more databases (e.g., relational, hierarchical, object-oriented, etc.), as one or more sets of files in proprietary or open formats, or as any other suitable persistent and in-memory data structures.

In step 624, the editor logic finds all input and output terminals of the block components on the list of components (ListUMs). By way of illustration, the editor logic may search the data structure(s) representing each block component on the list (ListUMs) and may identify any input terminal(s) and output terminal(s) that are specified for each such block component.

In step 626, the editor logic finds all possible routes from each input and output terminal of each block component on the list of components (ListUMs) to any input and output pin on the programmable target device. By way of illustration, the editor logic may traverse configuration data for the various local and global interconnects in the programmable target device and may determine which route(s) between each input/output terminal of each block component on the list and any input/output pin can be traversed by a signal during operation of the programmable target device.

In step 628, the editor logic removes from the routes (as found in step 626) any routes having an endpoint pin that is not the source pin selected by the user/designer. After this removal operation, the remaining routes represent all possible routes for the selected source pin.

In step 630, the editor logic stores the remaining routes into a list that represents all possible routes for the selected source pin. By way of illustration, the editor logic may determine the interconnect data for each identified route, and may store such interconnect data into the list of all possible routes for the selected pin. The editor logic then returns (or sends) this list of all possible routes for further processing (e.g., such as processing in accordance with the operations in steps 534 and/or 524 of FIG. 5).

In some embodiments, to auto-route a signal from a routing resource to a pin or a block component, the user/designer may press a designated keyboard button (e.g., the "Shift" key) and then click on the desired start routing resource. After the start routing resource is clicked on, the appropriate logic finds all possible routes from the selected start routing resource to any pins and block components. To complete the desired route, the user/designer clicks on the destination of the route. In some embodiments, a connection from a routing resource to a block component may be displayed in a user interface as an indication at the input terminal of the block component. In some embodiments, a connection from a routing resource to a pin may be displayed in a user interface as an indication on the bottom of the appropriate interconnect corresponding to, or including, the routing resource.

Figure 6C:
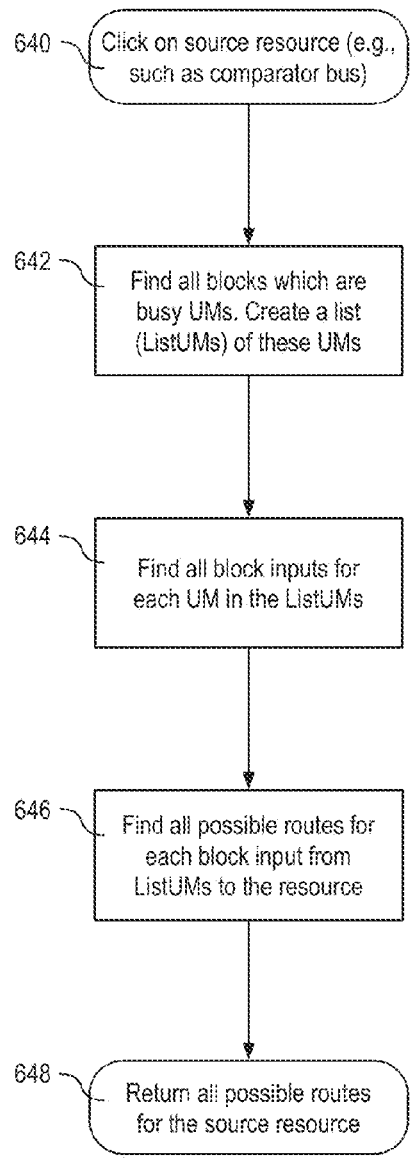
FIG. 6C is a flow diagram illustrating an example method for finding the available routes starting from a routing resource according to one embodiment.

FIG. 6C is a flow diagram illustrating an example method for finding the available routes starting from a routing resource in accordance with the auto-routing techniques described herein. The operations in FIG. 6C are described hereinafter as being performed by editor logic that is executed by one or more computer systems. It is noted, however, that various implementations and embodiments may use different, and possibly multiple, components to perform the method of FIG. 6C. For example, in various embodiments such components may be implemented in a single integrated component or their functionality may be spread across two or more components that may perform some additional operations and functionalities. Thus, the description hereinafter of the method in FIG. 6C is to be regarded in an illustrative rather than a restrictive sense.

In step 640, the editor logic receives user input that selects a source/start routing resource (e.g., such as a comparator bus) in an electronic design that is being placed on a certain programmable target device. For example, in some embodiments the editor logic may receive, trough a user interface, a mouse click on a device diagram location which is displayed on the user interface and which represents a routing resource of the programmable target device. The mouse click may be received separately from, or concurrently with, additional input such as, for example, keyboard input in the form of a pressed keyboard key.

In response, in step 642 the editor logic finds all block components (e.g., such as UMs) and input/output pins of the electronic design that have been placed on locations of the programmable target device, and creates a list of these components and pins (e.g., a list of UMs and pins, or ListUMs). By way of illustration, the editor logic may search a data store to determine which block components and pins represented therein are mapped to locations, on the programmable target device, that are associated with identifiable hardware element(s), primitive(s), or other physical resource(s) of the device. In various embodiments, a data store may be implemented as a set of XML documents, as one or more databases (e.g., relational, hierarchical, object-oriented, etc.), as one or more sets of files in proprietary or open formats, or as any other suitable persistent and in-memory data structures.

In step 644, the editor logic finds all input and output terminals of the block components on the list of components (ListUMs). By way of illustration, the editor logic may search the data structure(s) representing each block component on the list (ListUMs) and may identify any input terminal(s) and output terminal(s) that are specified for each such block component.

In step 646, the editor logic finds all possible routes to the selected source routing resource from each pin and from each input and output terminal of each block component on the list of components (ListUMs). By way of illustration, the editor logic may traverse configuration data for the various local and global interconnects in the programmable target device and may determine which route(s) between the selected source routing resource and each pin and each input/output terminal of each block component on the list can be traversed by a signal during operation of the programmable target device.

In step 648, the editor logic stores the routes that it found into a list representing all possible routes for the selected routing resource. By way of illustration, the editor logic may determine the interconnect data for each identified route, and may store such interconnect data into the list of all possible routes for the selected routing resource. The editor logic then returns (or sends) this list of all possible routes for further processing (e.g., such as processing in accordance with the operations in steps 534 and/or 524 of FIG. 5).

IV. Examples of User Interfaces

Figure 7:
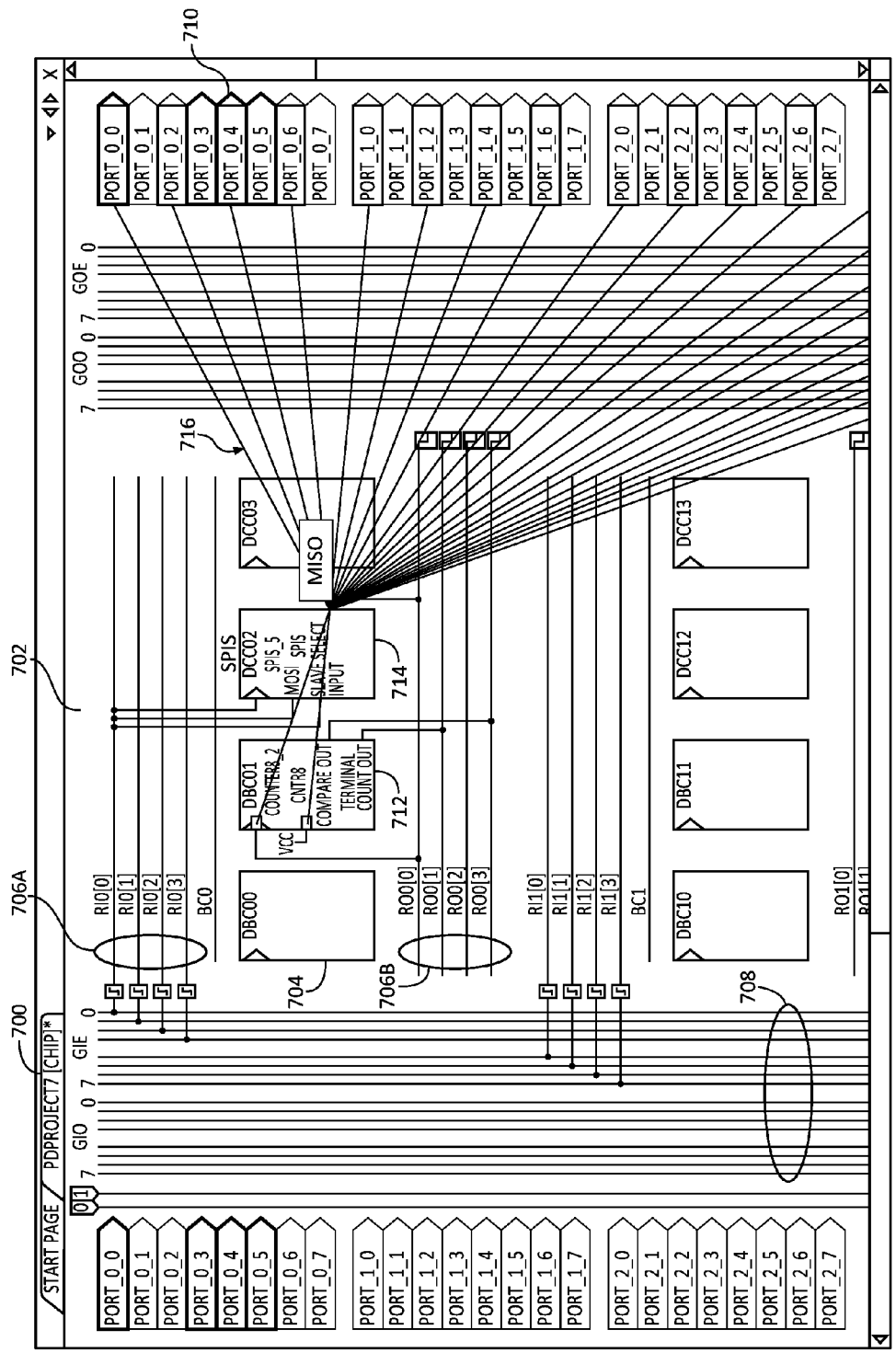
FIG. 7 is a block diagram illustrating an example view in a user interface used in finding and displaying the available routes from a block component according to an example design in one embodiment.

FIG. 7 is a block diagram illustrating an example view in a user interface used in finding and displaying the possible routes from a block component according to an example embodiment. In this embodiment, placement view 700 is a tab on a GUI, where view 700 shows a diagram 702 of a programmable target device. Device diagram 702 includes visual representations of various hardware elements, routing resources, and other physical components of the programmable target device.

For example, device diagram 702 includes several digital block locations (e.g., such as location 704) that are identified as "DBC00", "DBC01", "DCC02", "DCC03", "DBC10", "DBC11", "DCC12", "DCC13", etc. Device diagram 702 also includes input local/horizontal interconnects (e.g., such as interconnect 706A) that include interconnect lines identified as "RI0[0]", "RI0[1]", "RI0[2]", "RI0[3]", "RI1[0]", "RI1[1]", "RI1[2]", "RI1[3]", etc. Device diagram 702 also includes output local/horizontal interconnects (e.g., such as interconnect 706B) that include interconnect lines identified as "RO0[0]", "RO0[1]", "RO0[2]", "RO0[3]", "RO1[0]", etc. Device diagram 702 also includes one or more global/vertical interconnects such as interconnect 708.

Device diagram 702 includes several pins (e.g., such as pin 710), where the notation "Port_x_y" indicates pin "y" on port "x". For example, pin 710 is indicated as "Port_0_4", which indicates pin "4" on port "0". Device diagram 702 illustrates the pins in several ports identified as "Port_0_0" to "Port_0_7", "Port_1_0" to "Port_1_7", "Port_2_0" to "Port_2_7", etc.

During the placement of an electronic design onto device diagram 702, the user/designer places at least two block components on the Universal Digital Block (UDB) device locations identified as "DBC01" and "DCC02". For example, the user/designer may drag and drop a counter block component 712 ("CNTR8") from a visual toolbox (or other visual tool provided by the editor logic operating view 700) onto UDB device location "DBC01". Similarly, the user/designer may drag and drop a SPI-slave block component 714 ("SPIS") from the visual toolbox (or other visual tool) onto UDB device location "DCC02".

Once the user/designer has placed block components 712 and 714 onto device diagram 702 in this manner, the user/designer invokes auto-routing as described herein to determine the block and pin destinations to which a signal can be routed from the (Master-In-Slave-Out, or MISO) terminal of block component 714. For example, the user/designer may use a combination of keyboard input (e.g., press and hold the "Shift" key) and mouse input (e.g., mouse click) to select the MISO terminal of block component 714. In response, the editor logic operating view 700 automatically determines the list of all possible routes to which the MISO terminal of block component 714 can be routed, and displays a set of visual objects (e.g., such as lines 716) that indicate the destinations (e.g., block components and pins) to which this terminal can be routed. For example, as illustrated in FIG. 7, the MISO terminal of block component 714 can be routed to a number of pins on ports "0", "1", and "2", as well as to two of the terminals on block component 712. At this point, the user/designer can select the routing destination for the MISO terminal of block component 714 by clicking on the endpoint of the desired route—e.g., the user/designer can select pin 710 as the endpoint by clicking thereon. In this manner, the auto-routing techniques described herein allow the user/designer to connect block components directly to pins and other components in the same GUI view 700 and without having to perform any manual routing steps to set configurations for interconnects and other routing resources.

Figure 8:
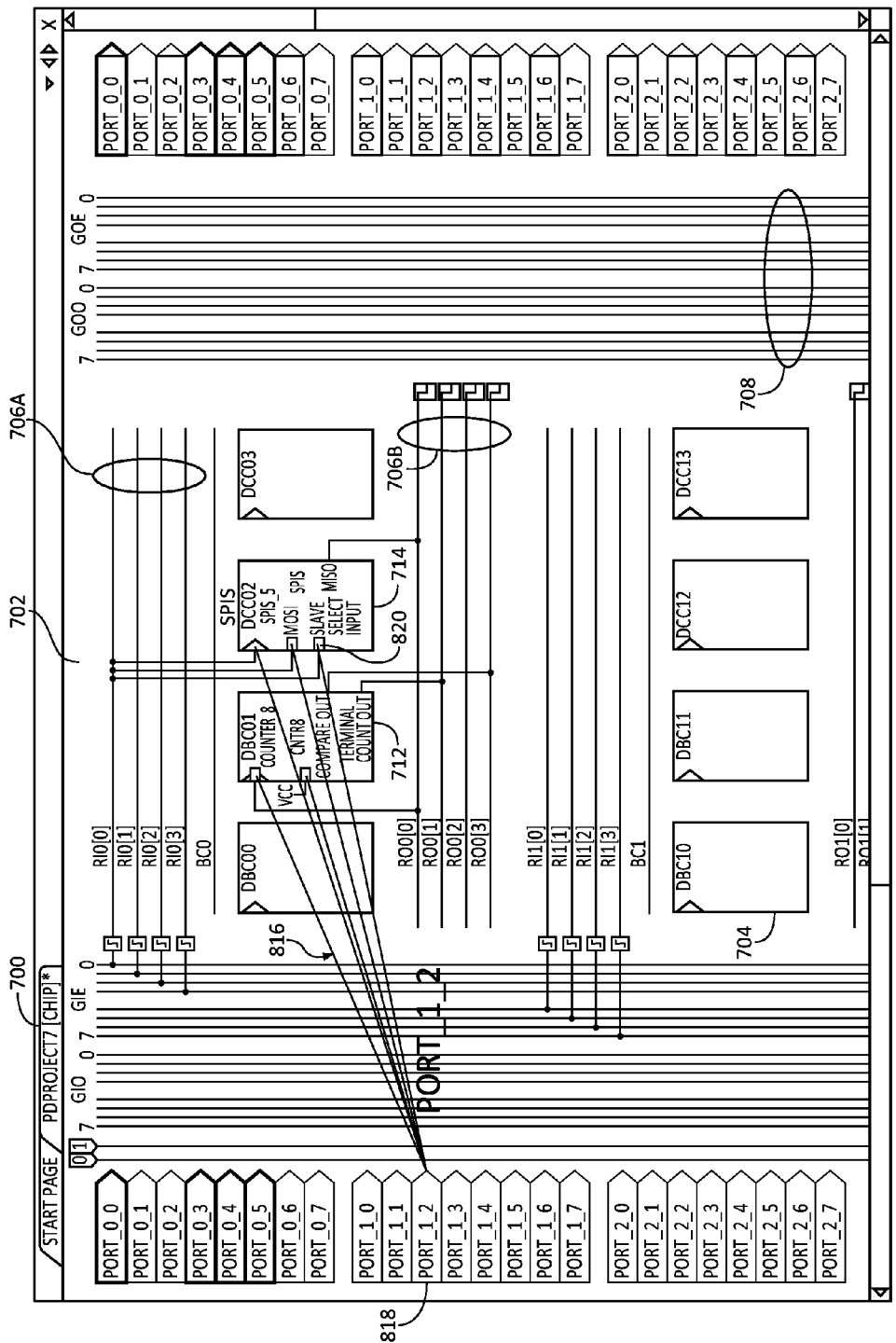
FIG. 8 is a block diagram illustrating an example view in a user interface used in finding and displaying the available routes from a pin according to an example design in one embodiment.

FIG. 8 is a block diagram illustrating an example view in a user interface used in finding and displaying the possible routes from a pin according to the example embodiment of FIG. 7. Similarly to FIG. 7, in FIG. 8 placement view 700 is a tab on a GUI and shows diagram 702 of the programmable target device. Device diagram 702 includes several digital block locations (e.g., such as location 704), input local/horizontal interconnects (e.g., such as interconnect 706A), output local/horizontal interconnects (e.g., such as interconnect 706B) and one or more global/vertical interconnects such as interconnect 708. During the placement of the electronic design onto device diagram 702, the user/designer places counter block component 712 ("CNTR8") onto UDB device location "DBC01" and SPI-slave block component 714 ("SPIS") onto UDB device location "DCC02".

Once the user/designer has placed block components 712 and 714 onto device diagram 702 in this manner, the user/designer invokes auto-routing as described herein to determine the block destinations to which a signal can be routed from pin 818 (which is labeled as "Port_1_2", meaning pin "2" on port "1"). For example, the user/designer may use a combination of keyboard input (e.g., press and hold the "Shift" key) and mouse input (e.g., mouse click) to select pin 818. In response, the editor logic operating view 700 automatically determines the list of all possible routes to which pin 818 can be routed, and displays a set of visual objects (e.g., such as lines 816) that indicate the destinations (e.g., block components) to which pin 818 can be routed. For example, as illustrated in FIG. 8, pin 818 can be routed to a number of input terminals on block components 712 and 714. At this point, the user/designer can select the routing destination for pin 818 by clicking on the endpoint of the desired route—e.g., the user/designer can select input terminal 820 of block component 714 as the endpoint by clicking thereon. In this manner, the auto-routing techniques described herein allow the user/designer to connect pins directly to block components in the same GUI view 700 and without having to perform any manual routing steps to set configurations for interconnects and other routing resources.

Figure 9:
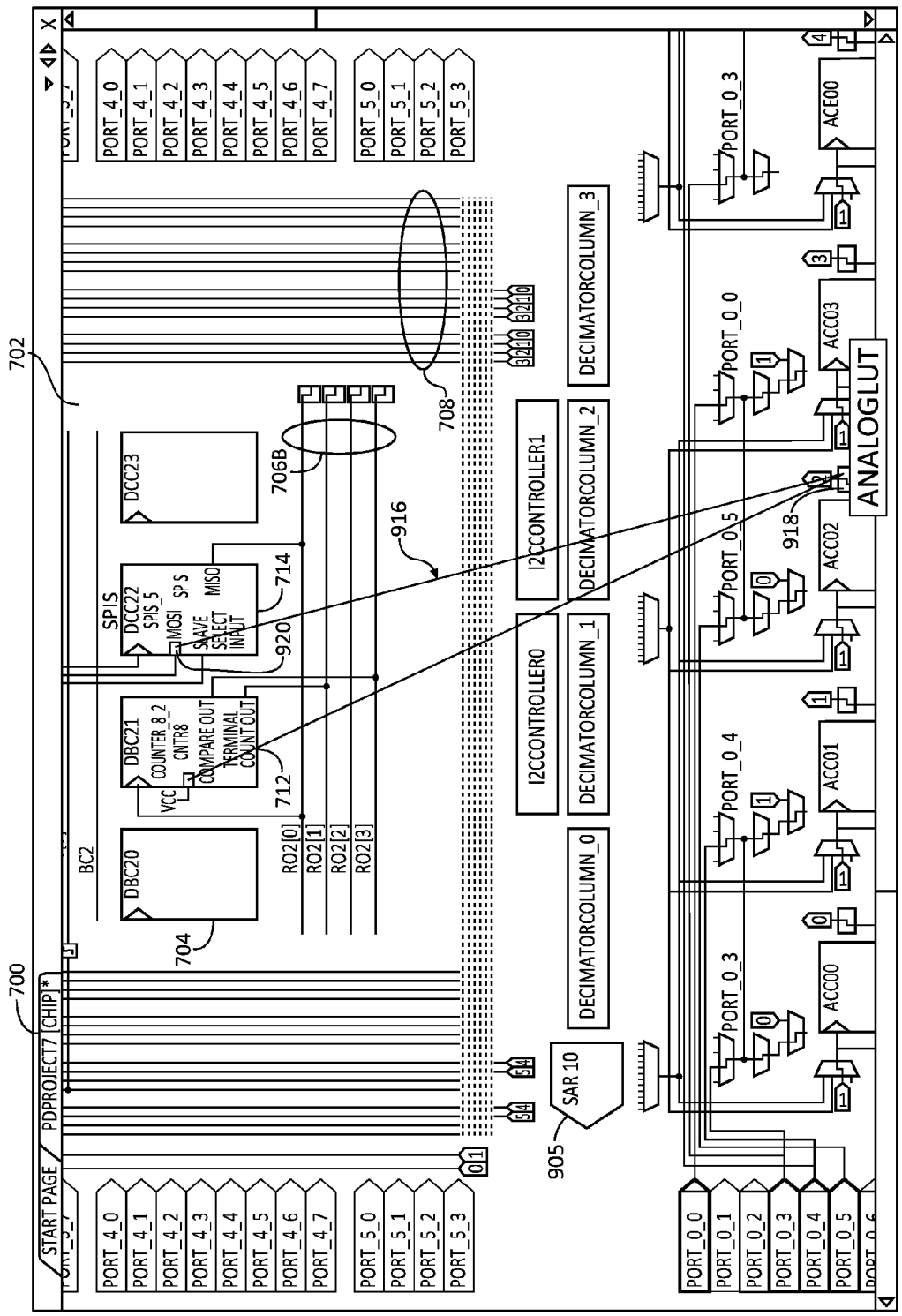
FIG. 9 is a block diagram illustrating an example view in a user interface used in finding and displaying the available routes from a routing resource in an example design according to one embodiment.

FIG. 9 is a block diagram illustrating an example view in a user interface used in finding and displaying the possible routes from a routing resource according to the example embodiment of FIG. 7. Similarly to FIG. 7, in FIG. 9 placement view 700 is a tab on a GUI and shows diagram 702 of the programmable target device. Device diagram 702 includes several digital block locations (e.g., such as location 704), output local/horizontal interconnects (e.g., such as interconnect 706B), one or more global/vertical interconnects such as interconnect 708, and one or more other device locations (e.g., such as location 905 for a 10-bit SAR). During the placement of the electronic design onto device diagram 702, the user/designer places counter block component 712 ("CNTR8") onto UDB device location "DBC21" and SPI-slave block component 714 ("SPIS") onto UDB device location "DCC22".

Once the user/designer has placed block components 712 and 714 onto device diagram 702 in this manner, the user/designer invokes auto-routing as described herein to determine the block destinations to which a signal can be routed from routing resource 918 (which is an analog LookUp Table, or "AnalogLUT"). For example, the user/designer may use a combination of keyboard input (e.g., press and hold the "Shift" key) and mouse input (e.g., mouse click) to select routing resource 918. In response, the editor logic operating view 700 automatically determines the list of all possible routes to which routing resource 918 can be routed, and displays a set of visual objects (e.g., such as lines 916) that indicate the destinations (e.g., block components) to which routing resource 918 can be routed. For example, as illustrated in FIG. 9, routing resource 918 can be routed to a number of input terminals on block components 712 and 714. At this point, the user/designer can select the routing destination for routing resource 918 by clicking on the endpoint of the desired route—e.g., the user/designer can select the input terminal 920 of block component 714 as the endpoint by clicking thereon. In this manner, the auto-routing techniques described herein allow the user/designer to connect routing resources directly to block components in the same GUI view 700 and without having to perform any manual routing steps to set configurations for interconnects and other routing resources.

Figure 10A:
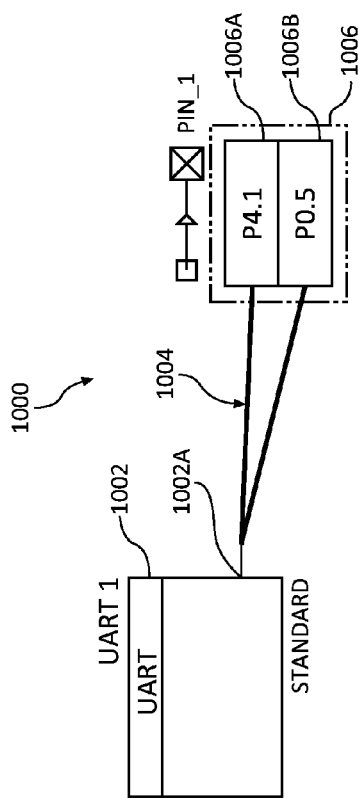
FIG. 10A is a block diagram illustrating the display of available routes in response to a user action in a user interface according one embodiment.
Figure 10B:
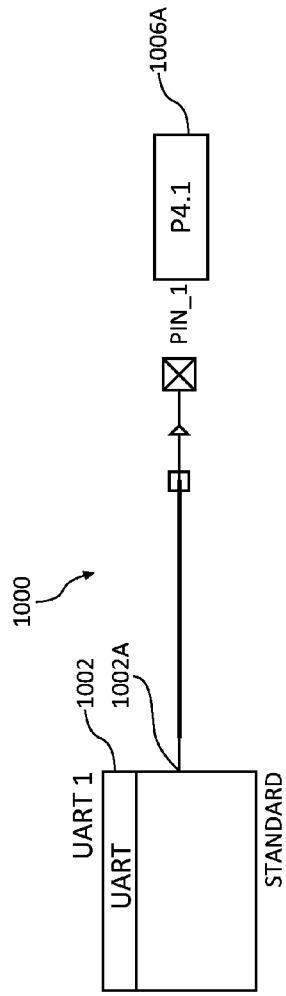
FIG. 10B is a block diagram illustrating a routed interconnect in response to a user selection in the example of FIG. 10A.

In some embodiments, to invoke auto-routing as described herein, the user/designer may use a combination of keyboard input and mouse input to select a design component from a user interface view displaying an electronic design overlaid on a representation of a programmable target device. In response, the editor logic automatically determines the list of all possible routes to which the selected design component can be routed, and displays the list of routes as a pull-down window, thereby indicating the destinations (e.g., endpoint components) to which the selected design component can be routed. FIGS. 10A and 10B illustrate these operations.

In FIGS. 10A and 10B, a portion of an electronic design is displayed in GUI view 1000. The portion of the electronic design includes block component 1002 (labeled as "UART__1"), which includes an output terminal 1002A. As illustrated in FIG. 10A, when the user/designer shift-clicks on output terminal 1002A, the editor logic automatically determines the list of all possible routes to which output terminal 1002A can be routed. The editor logic then displays a set of graphical lines 1004 which indicate only the endpoint components of the possible routes, without showing or otherwise indicating any other endpoints to which output terminal 1002A cannot be routed. The endpoint components are represented by a pull-down window 1006, and include pin 1006A (labeled as "P4.1") and pin 1006B (labeled as "P0.5"). It is noted that in this embodiment, any pins that may be logically arranged between pin 1006A and 1006B (e.g., such as pins "P0.6", "P0.7", . . . , "P3.7", "P4.0", etc.) are not displayed in the pull-down window 1006. At this point, as illustrated in FIG. 10B, the user/designer can lock and set the desired routing destination for output terminal 1002A by clicking on the endpoint of the desired route. For example, the user/designer can select pin 1006A as the endpoint component by clicking thereon, and the editor logic automatically configures the routing interconnect resources that comprise the selected route between output terminal 1002A and pin 1006A.

In some embodiments, some pins of an electronic design may be more advantaged than others. An example of this is an electronic design that includes pins to/from one or more operational amplifiers (opamps), where the analog input buses of the programmable target device may allow connection of block components to a plurality of pins, but some of the plurality of pins (e.g., such as the opamp input pins) are more preferred than others for connecting to some specific block components. In these embodiments, the auto-routing techniques described herein provide for color-based highlighting of the preferred pins in order to guide the user/designer to a more optimal selection. An example of this is illustrated in FIG. 11A.

Figure 11A:
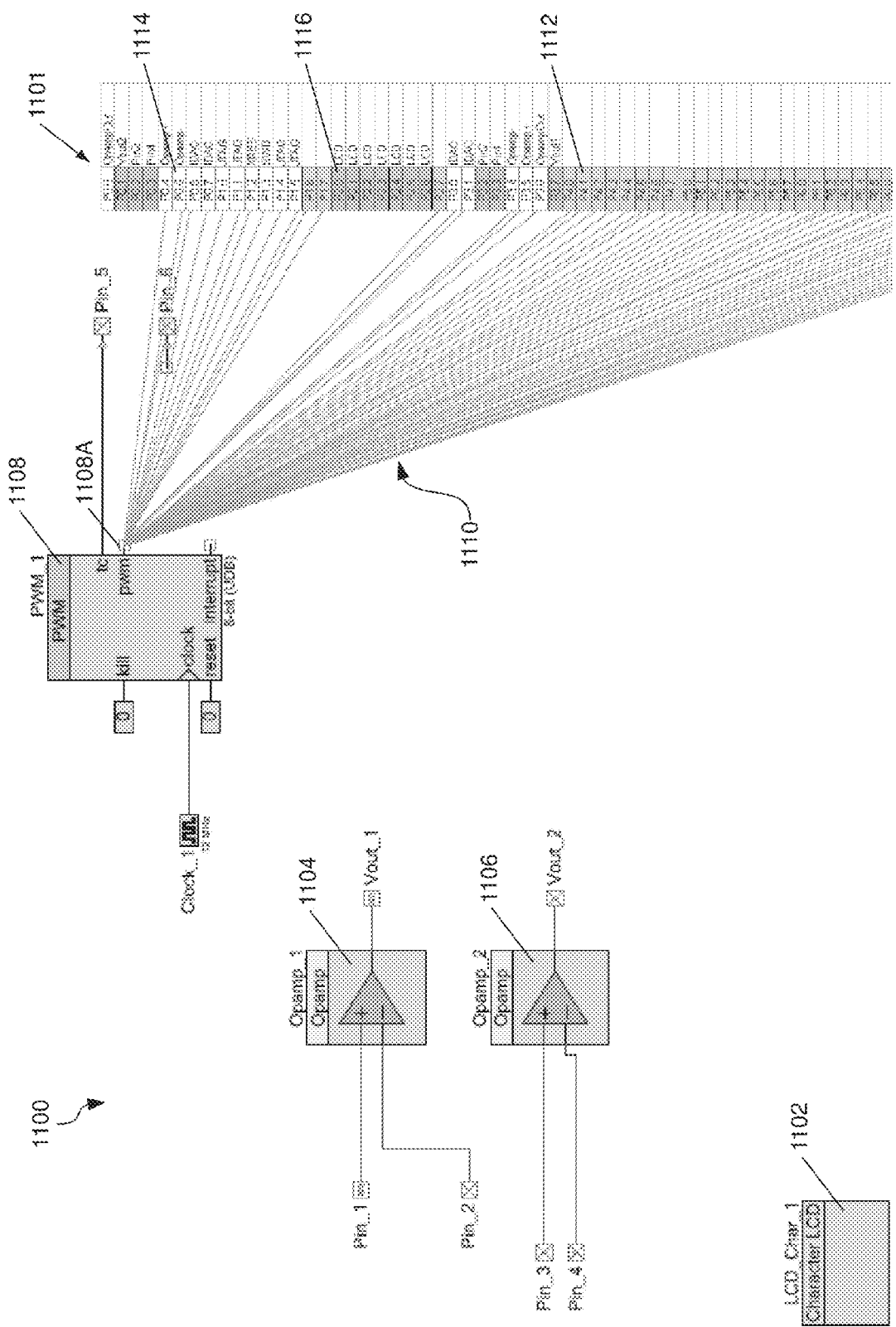
FIG. 11A illustrates a user interface displaying available routes in an example design with respect to a port-ordered diagram of a programmable target device according to one embodiment.

FIG. 11A illustrates a user interface displaying available routes in an example design with respect to a port-ordered diagram of a programmable target device. A port-ordered diagram lists the pins of the device in logical port order starting from the first pin (e.g., pin "0" on port "0") and proceeding to higher numbered pins (e.g., such as pin "0" on port "6", and beyond). In FIG. 11A, a portion of an electronic design is displayed in GUI view 1100 with respect to port-ordered diagram 1101. The portion of the electronic design includes block component 1102 (which is a LCD characters component and is labeled as "LCD_Char__1"), block component 1104 (which is an opamp and is labeled as "Opamp__1"), block component 1106 (which an opamp and is labeled as "Opamp__2"), and block component 1108 (which is a pulse-width modulator and labeled as "PWM__1"). Block component 1108 includes an input terminal 1108A.

As illustrated in FIG. 11A, when the user/designer shift-clicks on input terminal 1108A, the editor logic automatically determines the list of all possible routes to which input terminal 1108A can be routed. The editor logic then displays a set of graphical lines 1110 which indicate the endpoint components of the possible routes, which in this case are all pins. The readily available endpoint pins (e.g., such as pin 1112, labeled "P4.1") are highlighted in one color (e.g., orange), the pins which have specific function and may be more useful when committed to specific resources (e.g., such as pin 1114, labeled as "P0.5") are highlighted in a different color (e.g., white), and the pins which are already committed (e.g., such as pin 1116, labeled as "P2.0") are considered blocked and are highlighted in a third color (e.g., gray). Other pins, which may have alternative output levels (e.g., such as Special IO, or SIO, pins), may be displayed in a separate color so the user/designer can find them easily, and the editor logic may also display a color legend that explains the significance of each used color. After the editor logic displays the available endpoint pins in the designated colors, the user/designer can lock and set the desired routing destination for input terminal 1108A by clicking on the endpoint of the desired route. For example, the user/designer can select pin 1114 as the endpoint component by clicking thereon, and the editor logic automatically configures the routing interconnect resources that comprise the selected route between input terminal 1108A and pin 1114.

In some embodiments, it may be useful from a software design standpoint to display to the user/designer the pins of a programmable target device in a port-ordered diagram, as illustrated above in FIG. 11A. In other embodiments, a hardware look at pin-numbering may be useful to the user/designer from a hardware design standpoint. For example, since during hardware design the pin location may affect the layout of the PCB board on which the target device is used, any routing to pins may be more clearly understood by showing the physical layout of the target device and/or its chip package. An example of this is illustrated in FIG. 11B.

Figure 11B:
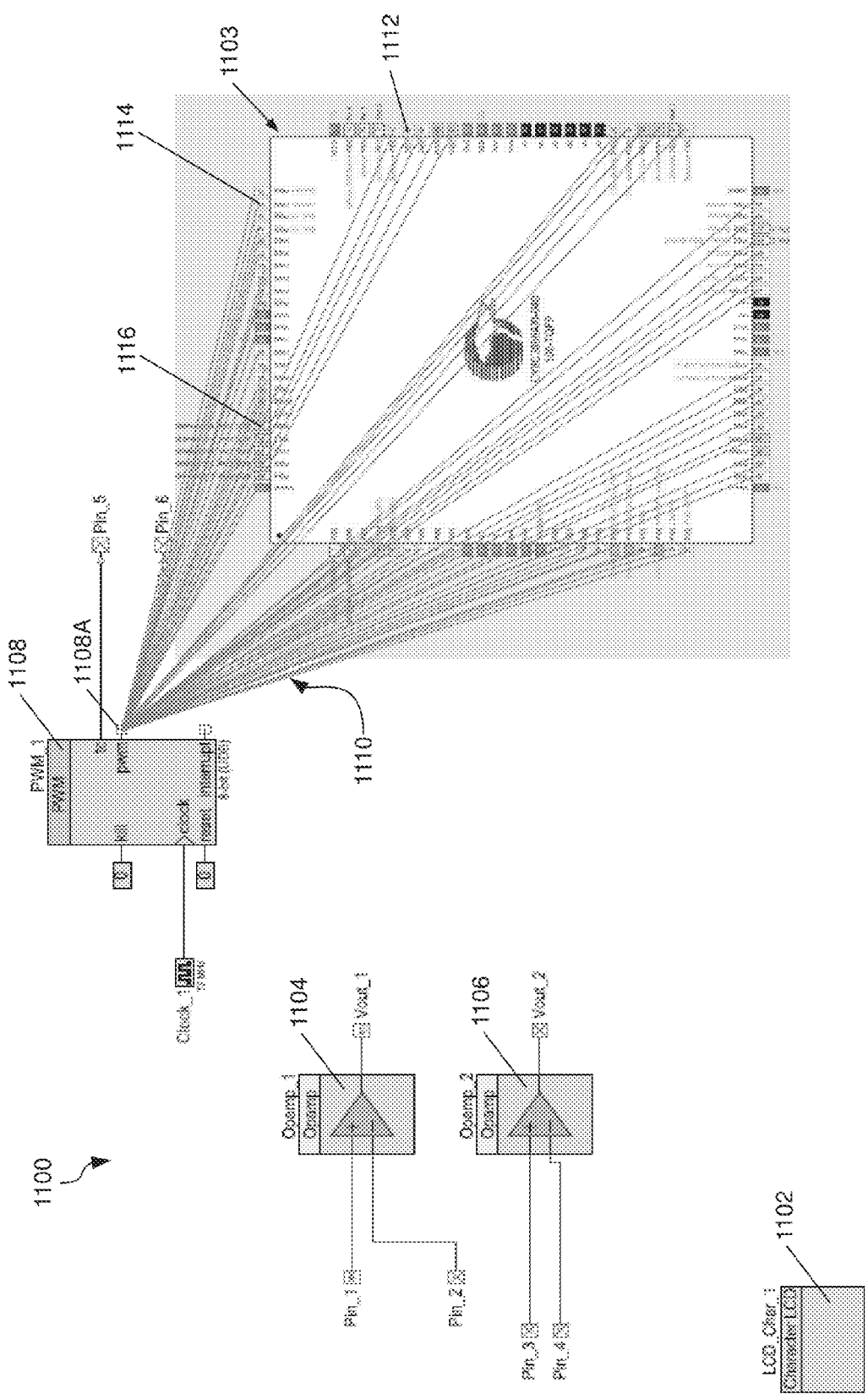
FIG. 11B illustrates a user interface displaying available routes in an example design with respect to a pin diagram of a programmable target device according to one embodiment.

FIG. 11B illustrates a user interface displaying available routes in an example design with respect to a pin diagram of a programmable target device. A pin diagram shows the package connectors of the deice pins on a diagram of a specific chip package that includes the target device. For example, pin diagram 1103 in FIG. 11B shows each pin of the target programmable device on its corresponding connector (or terminal) on the specified chip package. Similarly to FIG. 11A, GUI view 1100 of FIG. 11B displays a portion of an electronic design that includes block component 1102 (labeled as "LCD_Char__1"), block component 1104 (labeled as "Opamp__1"), block component 1106 (labeled as "Opamp__2"), and block component 1108 (labeled as "PWM__1"). Block component 1108 includes an input terminal 1108A.

As illustrated in FIG. 11B, when the user/designer shift-clicks on input terminal 1108A, the editor logic automatically determines the list of all possible routes to which input terminal 1108A can be routed. The editor logic then displays a set of graphical lines 1110 which indicate the endpoint components of the possible routes, which in this case are all pins. The readily available endpoint pins (e.g., such as pin 1112, labeled "P4.1") may be highlighted in one color (e.g., orange), the pins which have specific function and may be more useful when committed to specific resources (e.g., such as pin 1114, labeled as "P0.5") may be highlighted in a different color (e.g., white), and the pins which are already committed (e.g., such as pin 1116, labeled as "P2.0") are considered blocked and may be highlighted in a third color (e.g., gray). Other pins, which may have alternative output levels (e.g., such as SIO, pins), may be displayed in a separate color so the user/designer can find them easily, and the editor logic may also display a color legend that explains the significance of each used color. It is noted that the editor logic displays the available endpoint pins with respect to pin diagram 1103, thereby making it easy for the user/designer to decide which route to select while keeping in mind the PCB board layout and any other board connectivity and hardware requirements. After the editor logic displays the available endpoint pins with respect to pin diagram 1103, the user/designer can lock and set the desired routing destination for input terminal 1108A by clicking on the endpoint of the desired route. For example, the user/designer can select pin 1114 as the endpoint component by clicking thereon, and the editor logic automatically configures the routing interconnect resources that comprise the selected route between input terminal 1108A and pin 1114.

V. Alternative and/or Additional Embodiments

In various embodiments, the techniques for auto-routing described herein can be applied to various target devices. One example of such devices are digital signal controllers that include various elements such as Charge Time Measurement Units (CTMUs), UARTs, ADCs, and other advanced peripherals with low pin count and small footprint options. The auto-routing techniques described herein may be used for such devices to implement graphical component and pin selections in a configuration setting tool.

In some embodiments, the auto-routing techniques described herein may take additional parameters and factors when determining the list of possible routes from a user-selected block component, pin, or routing resource. Such additional parameters and factors may be accounted for automatically by the appropriate editor logic, or the editor logic may be configured to account for such parameters/factors in response to express user request(s) to do so. By way of illustration, in order to provide more flexibility, an editor logic may be configured to receive user input that describes additional conditions and dependencies between the design components of the design that is being placed, between the design components and the hardware elements on the programmable target device, and/or between the hardware elements of the target device itself. Examples of such conditions and dependencies include, without limitation, existing or other pre-set routes among the design components, size of the PCB board or other hardware platform on which the target device is to be used, and any other relationships that may affect the process of finding the most optimal routes for the design.

Figure 12:
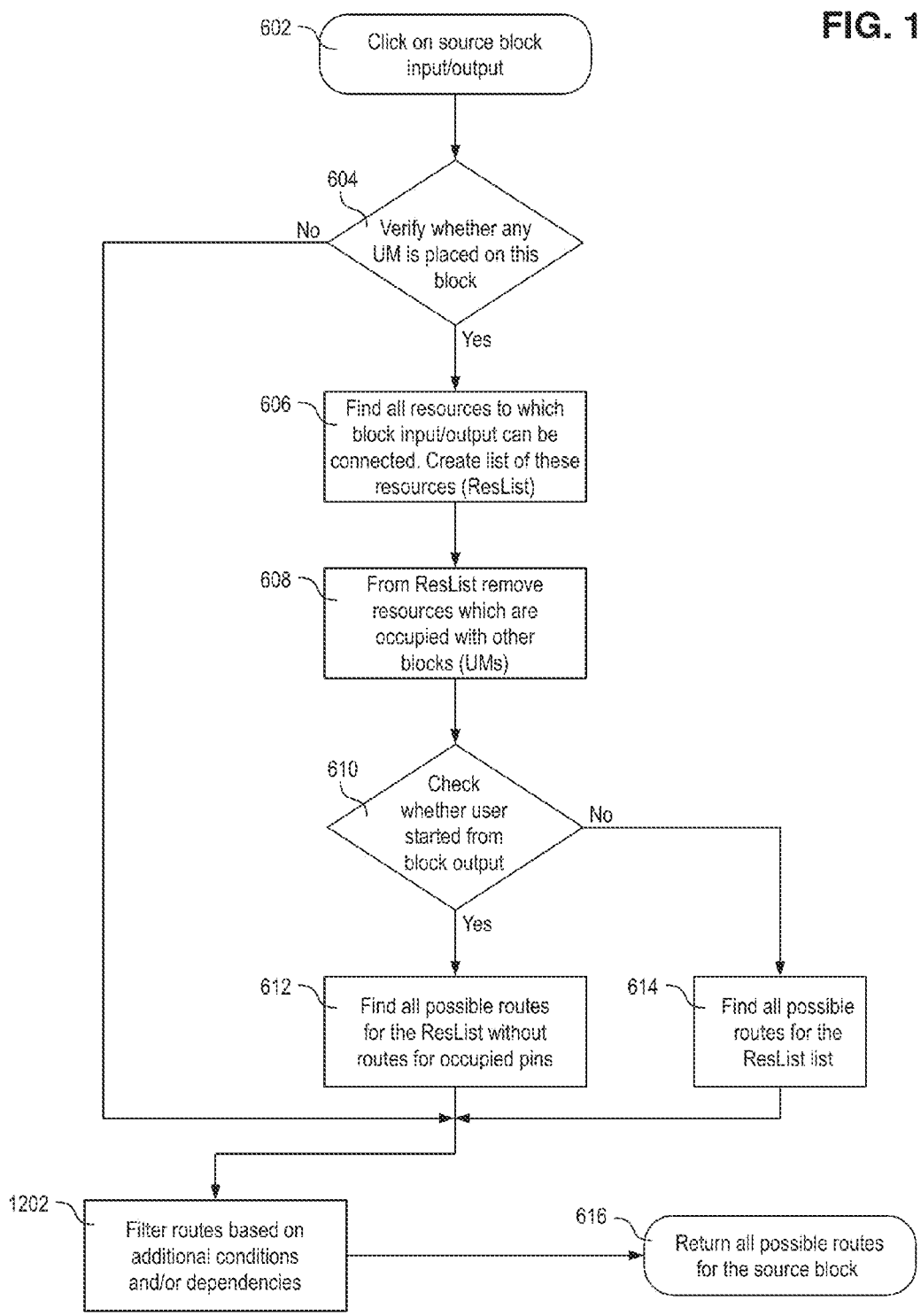
FIG. 12 is a flow diagram illustrating an example method for finding available routes by accounting for additional conditions and/or dependencies according to one embodiment.

FIG. 12 is a flow diagram illustrating a method for finding the possible routes from a block component by accounting for additional conditions and/or dependencies according to an example embodiment. The operations in FIG. 12 are described hereinafter as being performed by editor logic that is executed by one or more computer systems. It is noted, however, that various implementations and embodiments may use different, and possibly multiple, components to perform the method of FIG. 12. For example, in various embodiments such components may be implemented in a single integrated component or their functionality may be spread across two or more components that may perform some additional operations and functionalities. Thus, the description hereinafter of the method in FIG. 12 is to be regarded in an illustrative rather than a restrictive sense.

In step 602, the editor logic receives user input that selects a source/start block component in an electronic design that is being placed on a certain programmable target device. The source block component may be a digital block component or an analog block component, and the user input may indicate an input terminal or an output terminal of the source block component. In step 604, the editor logic verifies whether the selected source block component (e.g., such as UM) is placed. By way of illustration, the editor logic may verify whether there is a mapping that associates the source block component with the location on the diagram of programmable target device on which the user clicked, where the location is associated with certain identifiable hardware element(s), primitive(s), or other physical resource(s) of the device.

If in step 604 the editor logic determines that the user/designer clicked on a location on which a source block component has not been placed, the logic continues with the operations in step 1202 and eventually returns an empty list of possible routes to which the selection by the user/designer can be routed. Otherwise, if in step 604 the editor logic determines that the user/designer clicked on a "busy" location on which a source block component has been placed, the logic continues with the operations in step 606.

In step 606, the editor logic finds all design components to which the selected source block component can be connected and creates a list of these components (e.g., a resource list, or ResList). By way of illustration, the editor logic may traverse a data source of all available design components and may check whether the selected source block component (and/or its terminal input/output) can connect through local/horizontal interconnects and/or global/vertical interconnects to various pins and output/input terminal(s) of other block component(s). In step 608, the editor logic prunes out from the list of design components (ResList) any design components that have already been assigned, connected, occupied, or otherwise used in the electronic design.

In step 610, the editor logic checks whether the user/designer clicked on an output terminal of the selected source block component. If the user/designer clicked on an output terminal of the selected source block component, then in step 612 the editor logic finds all possible routes from the source block component to each design component (e.g., block component or pin) on the list of design components (ResList) except for routes leading to occupied pin(s). If in step 610 the editor logic determines that the user/designer did not click on an output terminal of the selected source block component, then in step 614 the editor logic finds all possible routes from the source block component to each design component (e.g., block component or pin) on the list of design components (ResList). From steps 612 and 614 the editor logic proceeds with the operations in step 1202.

In step 1202, the editor logic filters the list of possible routes created in the previous step(s) based on additional conditions and/or dependencies that may have been configured for the editor logic or that may have been expressly requested/entered by the user/designer. For example, the editor logic may automatically take into account any routes that have been pre-set, reserved for system use, or otherwise restricted or protected. In another example, the user-designer may enter one or more parameters specifying the size of an ITO panel on which the programmable target device is to be used, and the editor logic may use this size in filtering any routes that would not work properly or would simply be too long to convey signals during operation of the target device. After filtering the list of possible routes based on the additional conditions and/or dependencies in this manner, the editor logic proceeds with the operations in step 616.

In step 616, the editor logic combines the filtered routes into a list that represents all possible routes for the selected source block component. The editor logic then returns (or sends) the list of all possible routes for further processing (e.g., such as processing in accordance with the operations in steps 534 and/or 524 of FIG. 5).

It is noted that in some embodiments, filtering operations based on additional conditions and/or dependencies (e.g., such as the operations in step 1202 above) may be used in methods for finding the possible routes from a pin (e.g., such as the method in FIG. 6B). In some embodiments, filtering operations based on additional conditions and/or dependencies (e.g., such as the operations in step 1202 above) may be used in methods for finding the possible routes from a routing resource (e.g., such as the method in FIG. 6C). Thus, the above example with respect to FIG. 12 of using filtering operations based on additional conditions and/or dependencies is to be regarded in an illustrative rather than a restrictive sense.

In some embodiments, the techniques for auto-routing described herein may be used in an EDA tool that is used to configure programmable target devices with a cross-point matrix. A cross-point matrix is a routing system that is used in certain target devices and that generally includes interconnects to convey signals along routes in one (e.g., X) direction and along routes in different (e.g., Y) direction. According to the auto-routing techniques described herein, in such routing system an editor logic can select and configure any user-selected routes by setting the switches at the crossing points in this matrix. In this manner, the techniques described herein allow the user/designer to select and configure routes between source components and destination components without any extensive knowledge of the various settings and parameters of the routing matrix.

In some embodiments, the techniques for auto-routing described herein may be used to simplify configuration of simple microcontrollers that have fixed configurable periphery (e.g., by allowing the user/designer to choose input and output signals).

In some embodiments, the techniques for auto-routing described herein may be used in applications for automatic tracing of ITO panels. For example, the techniques described herein may be used to find all possible routes for transmit (TX) and receive (TX) signal, or to find most optimal RX/TX routes depending on the size of the ITO panel being used.

VI. Conclusion

Various embodiments of the techniques for auto-routing described herein may include various operations. These operations may be performed by hardware elements, software, firmware, or a combination thereof. As used herein, the term "coupled to" may mean coupled directly or indirectly through one or more intervening elements. Any of the signals provided over various buses and switches described herein may be time multiplexed with other signals and provided over one or more common buses. Additionally, the interconnection between circuit elements or blocks may be described and shown as buses or as single signal lines. Each of the buses may alternatively be one or more single signal lines and each of the single signal lines may alternatively be buses.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method for editing a representation of an electronic design, the method comprising:
displaying, in a user interface, a representation of a programmable target device;
receiving, in the user interface, first user input that indicates a first component in the electronic design for the programmable target device;
wherein the first component has been placed but not routed for the programmable target device;
determining one or more second components of the electronic design that have available routes to the first component;
displaying, in the user interface, one or more visual objects that indicate the one or more second components;
receiving, in the user interface, second user input that selects a particular component from the one or more second components of the electronic design; and
storing interconnect data indicating that the first component is routed to the particular component;
wherein the method is performed by one or more computer systems.

2. The method of claim 1, wherein the first user input comprises one or more of a keyboard input and a pointing device input.

3. The method of claim 1, wherein displaying the representation of the programmable target device and receiving the first user input and the second user input are performed in one view of the user interface.

4. The method of claim 1, wherein displaying the one or more visual objects comprises displaying a list of the one or more second components in a pull-down window.

5. The method of claim 1, wherein displaying the one or more visual objects comprises displaying the one or more visual objects overlaid on the representation of the programmable target device.

6. The method of claim 5, wherein the representation of the programmable target device is one of a port-ordered diagram of the device and a pin diagram of the device.

7. The method of claim 1, wherein:
the first component includes digital block output and the particular component includes pin or digital block input;
the first component includes digital block input and the particular component includes pin or digital block output;
the first component includes pin and the particular component includes digital block input or digital block output;
the first component includes resource and the particular component includes pin or digital block;
the first component includes analog block output and the particular component includes analog block input or resource; or
the first component includes analog block input and the particular component includes analog block output, pin, or resource.

8. The method of claim 1, further comprising using a condition or a dependency in addition to the first component and occupied resources when determining the one or more second components.

9. The method of claim 1, wherein the interconnect data comprises configuration of a route on the programmable target device between the first component and the particular component.

10. The method of claim 1, wherein the interconnect data comprises configuration of a route on the programmable target device between the first component and the particular component, and wherein the first component is a source of the route and the particular component is a destination of the route.

11. A non-transitory computer-readable medium storing a set of instructions for editing a representation of an electronic design, wherein the set of instructions comprises instructions which, when executed by one or more computer systems, cause the one or more computer systems to perform operations comprising:
  displaying, in a user interface, a representation of a programmable target device;
  receiving, in the user interface, first user input that indicates a first component in the electronic design for the programmable target device;
  wherein the first component has been placed but not routed for the programmable target device;
  determining one or more second components of the electronic design that have available routes to the first component;
  displaying, in the user interface, one or more visual objects that indicate the one or more second components;
  receiving, in the user interface, second user input that selects a particular component from the one or more second components of the electronic design; and
  storing interconnect data indicating that the first component is routed to the particular component.

12. The non-transitory computer-readable medium of claim 11, wherein the first user input comprises one or more of a keyboard input and a pointing device input.

13. The non-transitory computer-readable medium of claim 11, wherein the set of instructions comprises instructions which, when executed by the one or more computer systems, cause the one or more computer systems to display the representation of the programmable target device and to receive the first user input and the second user input in one view of the user interface.

14. The non-transitory computer-readable medium of claim 11, wherein the instructions that cause displaying the one or more visual objects comprise instructions which, when executed by the one or more computer systems, cause the one or more computer systems to display a list of the one or more second components in a pull-down window.

15. The non-transitory computer-readable medium of claim 11, wherein the instructions that cause displaying the one or more visual objects comprise instructions which, when executed by the one or more computer systems, cause the one or more computer systems to display the one or more visual objects overlaid on the representation of the programmable target device.

16. The non-transitory computer-readable medium of claim 15, wherein the representation of the programmable target device is one of a port-ordered diagram of the device and a pin diagram of the device.

17. The non-transitory computer-readable medium of claim 11, wherein:
  the first component includes digital block output and the particular component includes pin or digital block input;
  the first component includes digital block input and the particular component includes pin or digital block output;
  the first component includes pin and the particular component includes digital block input or digital block output;
  the first component includes resource and the particular component includes pin or digital block;
  the first component includes analog block output and the particular component includes analog block input or resource; or
  the first component includes analog block input and the particular component includes analog block output, pin, or resource.

18. The non-transitory computer-readable medium of claim 11, wherein the set of instructions further comprises instructions which, when executed by the one or more computer systems, cause the one or more computer systems to use a condition or a dependency in addition to the first component and occupied resources when determining the one or more second components.

19. The non-transitory computer-readable medium of claim 11, wherein the interconnect data comprises configuration of a route on the programmable target device between the first component and the particular component.

20. The non-transitory computer-readable medium of claim 11, wherein the interconnect data comprises configuration of a route on the programmable target device between the first component and the particular component, and wherein the first component is a source of the route and the particular component is a destination of the route.

* * * * *